United States Patent
Lee et al.

(10) Patent No.: US 11,217,709 B2
(45) Date of Patent: Jan. 4, 2022

(54) GRAPHENE-SEMICONDUCTOR HETEROJUNCTION PHOTODETECTOR AND METHOD OF MANUFACTURING THE SAME

(71) Applicant: GWANGJU INSTITUTE OF SCIENCE AND TECHNOLOGY, Gwangju (KR)

(72) Inventors: Byoung Hun Lee, Gwangju (KR); Kyoung Eun Chang, Gwangju (KR)

(73) Assignee: GWANGJU INSTITUTE OF SCIENCE AND TECHNOLOGY

(*) Notice: Subject to any disclaimer, the term of this patent is extended or adjusted under 35 U.S.C. 154(b) by 0 days.

(21) Appl. No.: 16/864,077

(22) Filed: Apr. 30, 2020

(65) Prior Publication Data

US 2020/0350443 A1    Nov. 5, 2020

(30) Foreign Application Priority Data

May 3, 2019    (KR) .................. 10-2019-0052549
May 3, 2019    (KR) .................. 10-2019-0052555

(51) Int. Cl.
| | | |
|---|---|---|
| *H01L 31/0216* | (2014.01) | |
| *H01L 31/0224* | (2006.01) | |
| *H01L 31/18* | (2006.01) | |
| *H01L 31/113* | (2006.01) | |
| *H01L 31/028* | (2006.01) | |

(52) U.S. Cl.
CPC ...... *H01L 31/02162* (2013.01); *H01L 31/028* (2013.01); *H01L 31/0224* (2013.01); *H01L 31/1136* (2013.01); *H01L 31/1804* (2013.01)

(58) Field of Classification Search
None
See application file for complete search history.

(56) References Cited

U.S. PATENT DOCUMENTS

| | | | |
|---|---|---|---|
| 8,779,411 B2* | 7/2014 | Lee | H01L 33/04 |
| | | | 257/13 |
| 2012/0256167 A1* | 10/2012 | Heo | H01L 29/778 |
| | | | 257/27 |

(Continued)

FOREIGN PATENT DOCUMENTS

KR    20130121451 A    11/2013

*Primary Examiner* — Steven M Christopher
(74) *Attorney, Agent, or Firm* — Renaissance IP Law Group LLP

(57) ABSTRACT

In a graphene-semiconductor heterojunction photodetector and a method of manufacturing the same according to the present inventive concept, a source electrode and a test electrode are formed to face each other on a graphene layer, and a drain electrode is formed in a direction perpendicular to a central region portion of the graphene layer, so that the drain electrode may be physically separated from the graphene layer. Further, charges formed at the central region portion of the graphene layer are transmitted to the drain electrode through a substrate, so that high photosensitivity may be secured, and a high output voltage may be secured for the applied light. Accordingly, the drain electrode is formed at a side surface of the graphene layer, so that the size of the drain electrode may be easily controlled, and a high output voltage may be obtained.

15 Claims, 15 Drawing Sheets

100

(56) References Cited

U.S. PATENT DOCUMENTS

2016/0087042 A1\* 3/2016 Lee ............... H01L 29/165
                                              257/29
2017/0117430 A1\* 4/2017 Heo ............... H01L 27/144
2018/0261672 A1\* 9/2018 Cotton ............ H01L 31/028

\* cited by examiner

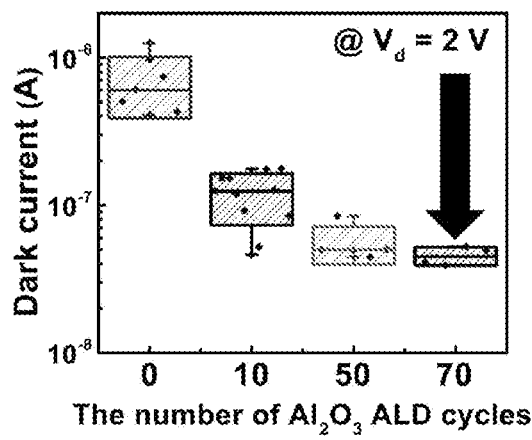
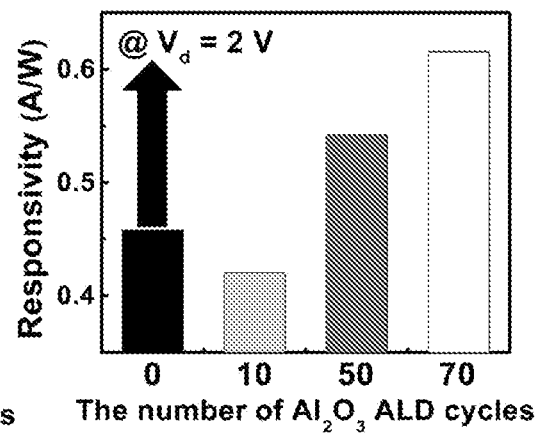
FIG.7A  FIG.7B
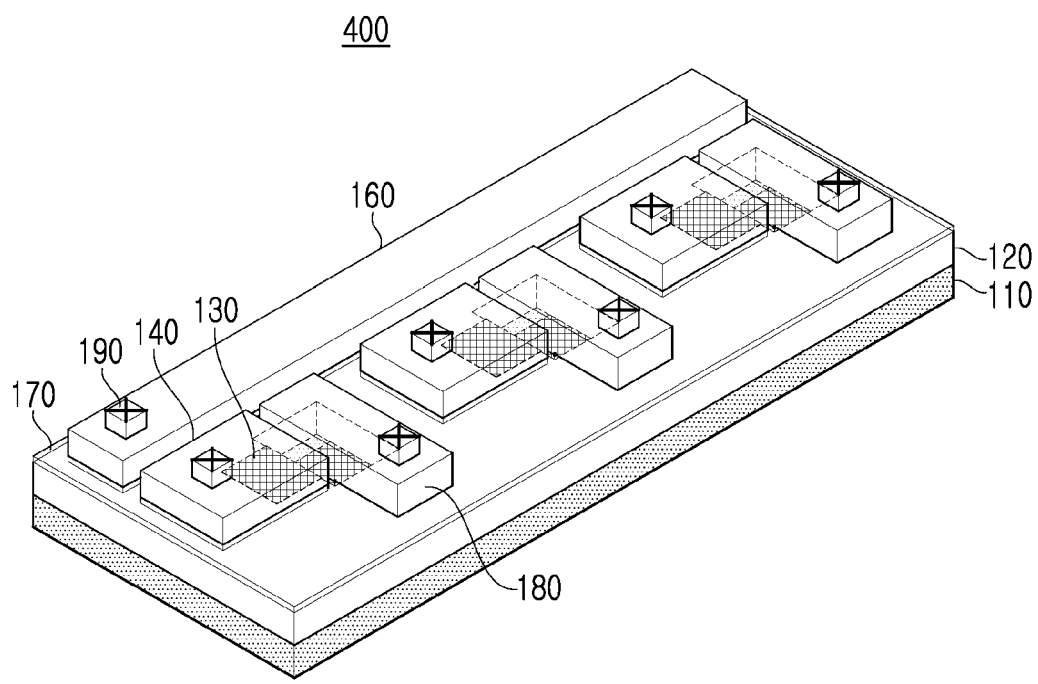
FIG.8

GRAPHENE-SEMICONDUCTOR HETEROJUNCTION PHOTODETECTOR AND METHOD OF MANUFACTURING THE SAME

CLAIM FOR PRIORITY

This application claims priority to Korean Patent Application No. 2019-0052549 filed on May 3, 2019 and No. 2019-0052555 filed on May 3, 2019 in the Korean Intellectual Property Office (KIPO), the entire contents of which are hereby incorporated by reference.

BACKGROUND

1. Technical Field

Example embodiments of the present disclosure relate to a graphene-semiconductor heterojunction photodetector and a method of manufacturing the same, and more specifically, to a graphene-semiconductor heterojunction photodetector capable of adjusting gain by applying a gate voltage and improving photodetection efficiency, and a method of manufacturing the same.

2. Related Art

Graphene is a sheet-shaped material composed of sp2 bonded carbon atoms and has a characteristic of zero band gap. That is, the graphene has characteristics in which band gap thereof is close to zero, and conduction and valence bands have a conical shape within an extremely low range with respect to the Fermi level.

Transistors or photodetectors using graphene as a channel have been proposed utilizing such characteristics.

In particular, a photodetector has a structure in which, when light is incident on an active region, the light induces a change in current to form a photocurrent.

For example, "Tunable graphene-silicon heterojunctions for ultrasensitive photodetection." by An, Xiaohong et al., (Nano letters, 2013) discloses a photodetector using a Schottky junction of graphene and silicon.

This is illustrated in FIG. 1.

FIG. 1 is a cross-sectional view illustrating a photodetector according to the related art.

Referring to FIG. 1, a graphene layer 20 is formed on a silicon substrate 10 doped with an n-type impurity, and silicon oxides 30 are formed on right and left sides of the substrate 10. A source electrode 40 and a drain electrode 50 are formed on the silicon oxides 30, respectively. In addition, a gate electrode 60 is formed on a rear surface of the silicon substrate 10. The graphene layer 20 is formed to extend to the source electrode 40 and the drain electrode 50.

In the above-described structure, a Schottky junction is formed between the graphene layer 20 and the silicon substrate 10, thereby forming a diode structure. When light is incident, a photocurrent is generated, and the photocurrent occurs throughout the entire interface between the graphene layer 20 and the silicon substrate 10, and thus photoresponsivity is significantly improved. However, there is a limitation in controlling the Fermi level of the graphene layer 20 because the silicon substrate 10 itself acts as a portion of the gate electrode 60 or the gate electrode 60 acts on the rear surface thereof. In addition, the height of a Schottky barrier may not be precisely controlled, and thus there is a disadvantage of exhibiting low photoresponsivity.

In addition, Korean Laid-Open Patent Publication No. 2013-0022852 discloses a graphene field-effect transistor, and specifically, a field-effect transistor including a graphene layer and an adjustable barrier layer between a semiconductor layer and a first electrode. That is, the height of the barrier of the semiconductor layer is controlled by adjusting the voltage applied to the first electrode, thereby improving the on/off ratio. However, the gate electrode of the above invention is made of Au, which is an opaque metal, and there is nothing said about use as a photodetector.

When the gain is adjusted according to an electric field applied from a gate, a photoelectric device functioning as a photodetector in various environments may have various applications. For example, in a low illuminance environment, the photodetector needs to achieve a high gain to improve sensitivity. In a high illuminance environment, the photodetector has a range of applications that can perform certain photodetection functions even with a relatively low gain. In addition, high photosensitivity is required according to a use environment, and relatively low photosensitivity is required according to another use environment.

Accordingly, there is a need for a photodetector capable of adjusting photosensitivity by controlling gain appropriately according to various use environments.

SUMMARY

Accordingly, example embodiments of the present inventive concept are provided to substantially obviate one or more problems due to limitations and disadvantages of the related art.

Example embodiments of the present inventive concept provide a graphene-semiconductor heterojunction photodetector capable of adjusting gain according to an applied gate voltage and improving photodetection efficiency by decreasing a dark current, and a method of manufacturing the same.

In some example embodiments, a graphene-semiconductor heterojunction photodetector includes a substrate, an insulating layer formed on the substrate, a graphene layer formed to extend from the substrate to the insulating layer, a source electrode formed on the insulating layer at one end of the extended graphene layer, a drain electrode formed on the substrate, a gate insulating layer formed on the graphene layer, and a gate electrode formed on the gate insulating layer and having light transmittance, wherein the drain electrode is physically separated from the graphene layer and is formed in a direction perpendicular to a direction in which the source electrode is connected to the graphene layer.

The graphene-semiconductor heterojunction photodetector may further include a test electrode formed on the other end of the extended graphene layer at a portion facing the source electrode.

The gate electrode may be formed between the source electrode and the test electrode.

The graphene-semiconductor heterojunction photodetector may further include a dopant layer doped with a p-type or n-type impurity on a surface of the graphene layer.

The dopant layer may include at least one material of polyacrylic acid (PAA) and polyethyleneimine (PEI).

The dopant layer may be formed on the surface of the graphene layer except for portions in contact with the source electrode and the test electrode.

The gate insulating layer may shield an exposed portion of each of the graphene layer and a surface of the substrate.

The graphene-semiconductor heterojunction photodetector may further include a wire connected to an exposed upper surface of each of the source electrode, the test electrode, the drain electrode, and the gate electrode, wherein the upper surface of each of the source electrode, the test electrode, the drain electrode, and the gate electrode is exposed from the gate insulating layer.

The graphene-semiconductor heterojunction photodetector may further include an intermediate layer formed between the substrate and the graphene layer.

The intermediate layer may include one material among $Al_2O_3$ and $HfO_2$ materials.

A tunneling current may be formed between the substrate and the graphene layer due to the intermediate layer.

The drain electrode may be formed at a side surface of a central region portion of the graphene layer.

The graphene layer, the source electrode, and the gate electrode may have an array form, and the drain electrode may be formed to extend along the entire width of the array of the source electrodes so as to be disposed adjacent to the source electrodes having an array form.

The drain electrode may be electrically connected to one of the source electrodes adjacent thereto.

The graphene layers having an array form may have areas with different sizes.

In other example embodiments, a method of manufacturing a graphene-semiconductor heterojunction photodetector includes forming an insulating layer on a substrate, forming a graphene layer to extend from the substrate to the insulating layer, forming a source electrode on the insulating layer to be in contact with one end of the extended graphene layer, forming a drain electrode on the substrate, forming a gate insulating layer on the graphene layer, and forming a gate electrode on the gate insulating layer.

The forming of the source electrode may further include forming a test electrode to be in contact with the other end of the extended graphene layer.

The method may further include, prior to the forming of the graphene layer, removing a predetermined portion of the insulating layer such that a portion of the substrate is exposed in the insulating layer.

The drain electrode may be formed in a direction perpendicular to a direction in which the source electrode is connected to the graphene layer at a side surface of a central region portion of the graphene layer.

The method may further include, after the forming of the source electrode, forming a dopant layer by doping an exposed surface of the graphene layer with an n-type or p-type impurity.

The method may further include forming an intermediate layer on the exposed portion of the substrate.

The method may further include connecting a wire to an exposed upper surface of each of the source electrode and the drain electrode, wherein the gate insulating layer is formed to expose the upper surface of each of the source electrode and the drain electrode.

The method may further include, prior to the forming of the graphene layer, removing portions of the insulating layer such that portions of the substrate are exposed in the form of an array in the insulating layer.

The graphene layer may be formed on each of the portions of the substrate exposed in the form of an array, and the source electrode may be formed on each of the graphene layers formed in the form of an array.

The drain electrode may be formed to extend along the entire width of the array of the source electrodes.

Advantageous Effects

According to the present inventive concept, a source electrode and a test electrode are formed to face each other on a graphene layer, and a drain electrode is formed in a direction perpendicular to a central region portion of the graphene layer, so that the drain electrode can be physically separated from the graphene layer.

Further, charges formed at the central region portion of the graphene layer are transmitted to the drain electrode through a substrate, so that high photosensitivity can be secured, and a high output voltage can be secured for the applied light. Accordingly, the drain electrode is formed at a side surface of the graphene layer, so that the size of the drain electrode can be easily controlled, and a high output voltage can be obtained.

Further, an intermediate layer is formed between the heterojunction components, the substrate and the graphene layer, so that, due to the asymmetric tunneling effect at the interface, electron injection can decrease and hole injection can increase. Accordingly, an energy barrier increases by the intermediate layer to decrease a dark current, and as the dark current decreases, photodetection efficiency can be improved.

Further, electron-hole pairs are formed in semiconductors as well as graphene, so that the photoabsorption rate and photoresponsivity of the photodetector increase, and photoelectric conversion gain that increases or decreases photoresponsivity is generated according to a gate voltage. By utilizing these, there is an advantage in that the photoresponsivity can be improved or the photoresponsivity can be controlled according to the application In addition, in a graphene-semiconductor heterojunction photodetector having an array form, the source electrodes are each formed on each of the graphene layers in the form of an array, and one drain electrode is formed in a direction perpendicular to the graphene layers in the form of an array and the source electrodes, so that the drain electrode can be commonly used. That is, as the drain electrode is commonly used, a light-receiving area per unit area of the photodetector can increase.

Further, the drain electrode is formed to extend along the entire width of an array of the source electrodes, so that wiring between the drain electrode and the desired source electrode can be selectively performed. Thus, an operating point can be randomly changed according to the wiring of the desired source electrode.

It should be noted that the technical effects of the present inventive concept are not limited to the above-described effects, and other effects of the present inventive concept will be apparent to those skilled in the art from the following descriptions.

BRIEF DESCRIPTION OF DRAWINGS

Example embodiments of the present inventive concept will become more apparent by describing example embodiments of the present inventive concept in detail with reference to the accompanying drawings, in which:

FIGS. 7A and 7B are graphs illustrating dark current characteristics and photoresponsivity according to the insertion of the intermediate layer of the present inventive concept;

FIG. 8 is a view illustrating a photodetector according to a fourth exemplary embodiment of the present inventive concept;

DESCRIPTION OF EXAMPLE EMBODIMENTS

Figure 1:
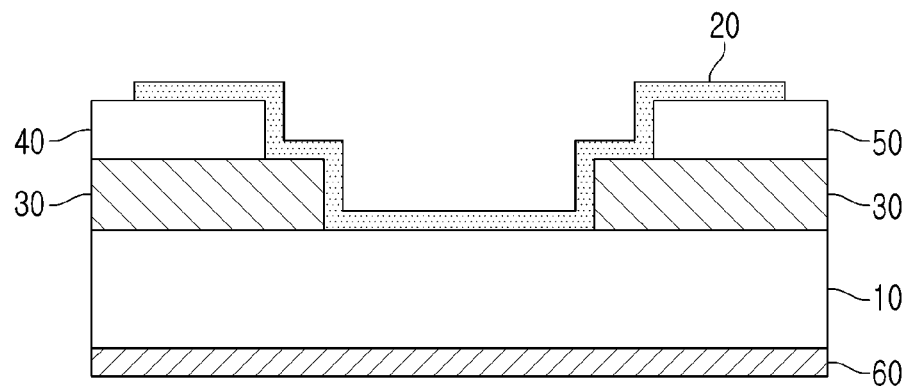
FIG. 1 is a cross-sectional view illustrating a photodetector according to the related art.

Hereinafter, example embodiments of the present inventive concept will be described in detail with reference to the accompanying drawings.

While the present inventive concept is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention.

It will be understood that when an element such as a layer, region, or substrate is referred to as being present "on" another element, the element can be directly present on the other element or intervening elements may also be present therebetween.

It will be understood that although the terms first, second, and the like may be used to describe various elements, components, regions, layers, and/or areas, these elements, components, regions, layers, and/or areas should not be limited by these terms.

Figure 2:
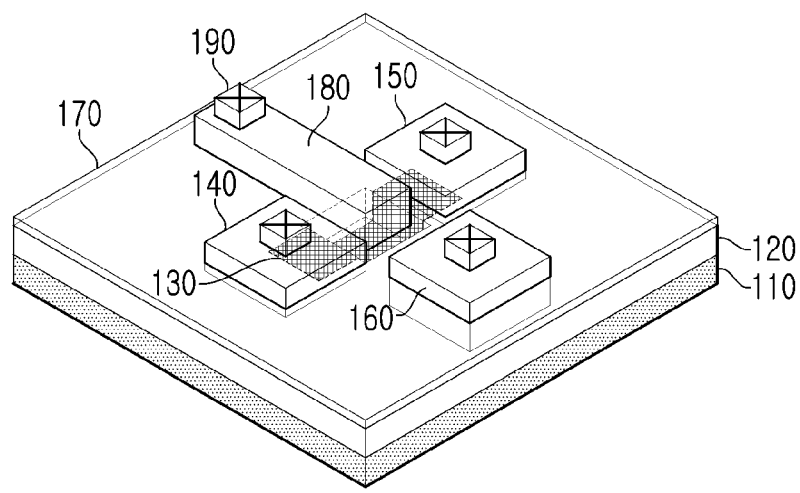
FIG. 2 is a view illustrating a photodetector according to a first exemplary embodiment of the present inventive concept.

FIG. 2 is a view illustrating a photodetector according to a first exemplary embodiment of the present inventive concept.

Referring to FIG. 2, a photodetector 100 according to the first embodiment of the present inventive concept includes a substrate 110, an insulating layer 120, a graphene layer 130, a source electrode 140, a test electrode 150, a drain electrode 160, a gate insulating layer 170, and a gate electrode 180.

The substrate 110 may be a doped semiconductor substrate 110. For example, the substrate 110 may be a p-type or n-type impurity-doped substrate 110, and may preferably be an n-type doped substrate 110. In addition, the substrate 110 may include silicon (Si) or germanium (Ge), but is not limited thereto, and may have other semiconductor materials doped with an n-type impurity.

The insulating layer 120 is formed on the substrate 110 and serves as an insulating film for insulating the source electrode 140 and the test electrode 150, which will be described later. The insulating layer 120 is preferably made of silicon nitride, silicon oxide, or the like, but may be made of any material as long as it can achieve insulation between the source electrode 140 and the test electrode 150 formed on the insulating layer 120 and the substrate 110. In addition, the insulating layer 120 may be formed using a thermal oxidation method, a chemical vapor deposition (CVD) method, a sputtering method, or the like.

The graphene layer 130 may be formed on the insulating layer 120 and the substrate 110. More specifically, a portion of the substrate 110 may be exposed through a process of etching a portion of the insulating layer 120, and then the graphene layer 130 may be formed to extend to the insulating layer 120 on both sides of the exposed portion of the substrate 110. That is, the graphene layer 130 may be formed so as to be simultaneously in contact with the substrate 110 and the insulating layer 120. At this point, due to a strong van der Waals force, the graphene layer 130 may be bonded to the substrate 110 without a separate process and an adhesive material.

The graphene layer 130 is made of a material having a honeycomb-shaped thin planar structure in which carbon atoms are connected to each other, and has a high conductivity in a plane. Here, the carbon atoms are connected to each other to form one carbon atom layer, and the graphene layer 130 may be formed of a single carbon atom layer or multiple carbon atom layers. Here, the graphene layer 130 formed of a single layer may have a thickness equal to a thickness of one carbon atom. The carbon atom may have a 6-membered ring as a basic unit or may be formed in a 5- or 7-membered ring. That is, the single-layered graphene layer 130 represents the graphene layer 130 composed of a single layer, and the multilayered graphene layer 130 represents the graphene layer 130 composed of at least two, that is, multiple layers, but in the example embodiments of the present inventive concept, the graphene layer 130 is not limited thereto, and the single-layered graphene layer 130 may be used in consideration of the light transmittance of a graphene structure and non-occurrence of interlayer peeling.

The source electrode 140 and the test electrode 150 may be formed on the insulating layer 120 such that the source electrode 140 and the test electrode 150 are in contact with one end and the other end of the graphene layer 130, respectively. That is, the source electrode 140 and the test electrode 150 are formed to be in contact with both sides of the graphene layer 130, which are formed on the insulating layer 120, except for the central region of the graphene layer 130, which is formed on the substrate 110. This results in a form in which a portion of the graphene layer 130 is interposed between the source electrode 140 or the test electrode 150 and the insulating layer 120, and the graphene layer 130 is electrically connected to the source electrode 140 or the test electrode 150. Accordingly, the source electrode 140 and the test electrode 150 may realize an equipotential with the graphene layer 130. In addition, since the source electrode 140 and the test electrode 150 are formed at one end and the other end of the graphene layer 130, respectively, the source electrode 140 and the test electrode 150 take a form in which they are formed in directions facing each other.

Here, the test electrode 150 may be used as an electrode for evaluating a device to check whether the device is normal or not. That is, by including the test electrode 150 connected to the graphene layer 130 in the device, it is possible to conveniently determine whether a device is normal or not.

The source electrode 140 and the test electrode 150 may each include a metal or metal oxide such as gold (Au), silver (Ag), aluminum (Al), nickel (Ni), molybdenum (Mo), tungsten (W), indium tin oxide (ITO), indium zinc oxide (IZO), or the like as a conductive material, but the present inventive concept is not limited thereto.

The drain electrode 160 may be formed on a portion of the substrate 110. More specifically, a portion of the insulating layer 120 at a lower side of the portion of the insulating layer 120, which is etched to form the graphene layer 130, is etched through an etching process to expose a portion of the substrate 110, and the drain electrode 160 may be formed on the exposed portion of the substrate 110. That is, the drain electrode 160 may be formed in a direction perpendicular to a virtual extension line connecting the source electrode 140 and the test electrode 150. Alternatively, the drain electrode 160 is disposed in a direction perpendicular to a direction in which the graphene layer 130 is extended.

Accordingly, the drain electrode 160 may be provided in a form physically separated from the graphene layer 130. This is because the test electrode 150 is added to the photodetector according to the present inventive concept in addition to the source electrode 140 and formed in a direction facing the source electrode 140 to be in contact with the graphene layer 130, and in order to physically separate the drain electrode 160 from the graphene layer 130, the drain electrode 160 may be formed in a direction perpendicular to the source electrode 140 and the test electrode 150.

That is, a structure may be implemented in which current generated at the interface between the graphene layer 130 and the substrate 110 is transmitted to the drain electrode 160 through the substrate 110 made of a semiconductor material. However, when the drain electrode 160 is formed in a direction in which the graphene layer 130 is formed, only electrons or holes among electron-hole pairs formed at an end portion of the graphene layer 130 are transmitted to the drain electrode 160 through the substrate 110 made of a semiconductor material, and thus it is difficult to ensure high photosensitivity.

However, in the present inventive concept, since charges formed at a central region portion of the graphene layer 130 are transmitted to the drain electrode 160 through the substrate 110, high photosensitivity may be secured, and a high output voltage may be secured for the applied light. Accordingly, since the drain electrode 160 is formed at a side surface of the graphene layer 130, the size of the drain electrode 160 may be easily controlled, and a high output voltage may be obtained.

The drain electrode 160 may include a metal or metal oxide such as gold (Au), silver (Ag), aluminum (Al), nickel (Ni), molybdenum (Mo), tungsten (W), indium tin oxide (ITO), indium zinc oxide (IZO), or the like as a conductive material, but the present inventive concept is not limited thereto.

The gate insulating layer 170 may be formed on the insulating layer 120. That is, the gate insulating layer 170 may be formed on the entire upper surface of the insulating layer 120 including the graphene layer 130 and the exposed portion of the substrate 110. Accordingly, the gate insulating layer 170 may simultaneously perform a passivation function for protecting the graphene layer 130 and the exposed portion of the substrate 110 from the outside in addition to a function for insulating the gate electrode 180. In addition, the gate insulating layer 170 needs to have light transmittance for the applied light and thus is preferably made of one of $Al_2O_3$ and $HfO_2$ which are transparent materials.

Here, the gate insulating layer 170 may be formed on the entire upper surface of the insulating layer 120 and may be formed to partially expose an upper portion of each of the source electrode 140, the test electrode 150, and the drain electrode 160. This is to form a separate wire 190 through the exposed region.

The gate electrode 180 may be formed on the gate insulating layer 170. The gate electrode 180 is required to include a light-transmitting material and have conductivity. Accordingly, it is desirable that the gate electrode 180 includes a ZnO material.

In the structure illustrated in FIG. 2, the graphene layer 130 has a single-layer structure, and thus a band diagram has a Dirac cone shape. In addition, a Schottky junction is formed between the graphene layer 130 and the substrate 110. In particular, since the substrate 110 is doped with an n-type impurity, majority carriers in the substrate 110 become electrons.

When the voltage applied through the gate electrode 180 has a negative value, the Dirac point of the graphene layer 130 falls below the Fermi level of the gate electrode 180, and the Fermi level of the substrate 110 falls below the Dirac point. Accordingly, the majority carriers in the graphene layer 130 become holes, and majority carriers in the substrate 110 become electrons, so that electrons of a conduction band induced in the substrate 110 or the graphene layer 130 may rapidly move to the drain electrode 160 to form a photocurrent. Such a photocurrent is based on the assumption that light applied from the outside is incident on the substrate 110 through the gate electrode 180, the gate insulating layer 170, and the graphene layer 130. That is, in the electron-hole pairs generated by the light incident on the substrate 110 and the graphene layer 130, the electrons move to the drain electrode 160 through the substrate 110, and the holes move to the graphene layer 130.

Further, when the voltage applied through the gate electrode 180 has a positive value, the Dirac point of the graphene layer 130 is set to be higher or equal to the Fermi level of the gate electrode 180. In addition, the Fermi level of the substrate 110 rises relative to the Dirac point of the graphene layer 130. The probability that the holes generated in the substrate 110 move to the graphene layer 130 is reduced due to the increase in the Fermi level. Complementary to this, the probability that electrons generated in the graphene layer 130 or the substrate 110 move to the drain electrode 160 is also reduced. Accordingly, the phenomenon in which the photocurrent also decreases due to the incidence of light occurs.

In the present embodiment, the Dirac point corresponds to the Fermi level of the graphene layer 130 and the substrate 110 when no bias is applied to the gate electrode 180, which has the same value as the Fermi level of the gate electrode 180.

In addition, in FIG. 2, it is desirable that the graphene layer 130 is physically separated from the drain electrode 160. When the graphene layer 130 and the drain electrode 160 are in physical contact with each other on the substrate 110, the Schottky barrier between the graphene layer 130 and the substrate 110 may lose the current control function, and there arises a problem that the carriers generated on the substrate 110 directly move to the drain electrode 160. In addition, as the probability that the holes in the graphene layer 130 move to the drain electrode 160 and recombine with electrons is increased, there arises a problem that the formation of the photocurrent is practically impossible.

Figure 3:
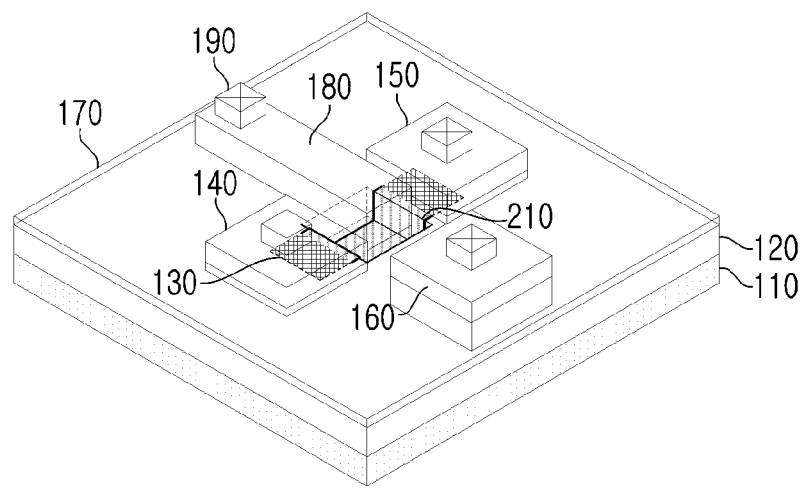
FIG. 3 is a view illustrating a photodetector according to a second exemplary embodiment of the present inventive concept.

FIG. 3 is a view illustrating a photodetector according to a second exemplary embodiment of the present inventive concept.

Referring to FIG. 3, a photodetector 200 according to the second embodiment of the present inventive concept has a structure including a substrate 110, an insulating layer 120, a graphene layer 130, a source electrode 140, a test electrode 150, a drain electrode 160, a gate insulating layer 170, and a gate electrode 180, like the photodetector 100 of the first embodiment, but includes the graphene layer 130 that is doped with a dopant. That is, the graphene layer 130 may include a dopant layer 210 formed on a surface thereof.

The dopant layer 210 formed on a portion of the graphene layer 130 may be formed on the exposed portion of the graphene layer 130 except for a portion thereof in contact with the source electrode 140 and the test electrode 150 when the graphene layer 130 is formed on the substrate 110 and the insulating layer 120, and the source electrode 140 and the test electrode 150 are formed on the graphene layer 130.

The dopant layer 210 is manufactured, for example, by applying a dopant solution over the graphene layer 130 at a corresponding site through bar-coating or spin-coating in dry air, and vacuum drying. Since the dopant layer 210 is in contact with the graphene layer 130, dopants located near the interface are chemically adsorbed on and doped (chemically doped) into the graphene layer 130.

The dopant layer 210 may be doped with a p-type or n-type impurity. As an example, a p-type doped material may include polyacrylic acid (PAA), and an n-type doped material may include polyethyleneimine (PEI).

Accordingly, when the dopant layer 210 doped with a p-type impurity is formed on the graphene layer 130, it may operate as a p-type semiconductor, and when the dopant layer 210 doped with an n-type impurity is formed on the graphene layer 130, it may operate as an n-type semiconductor.

Figure 4:
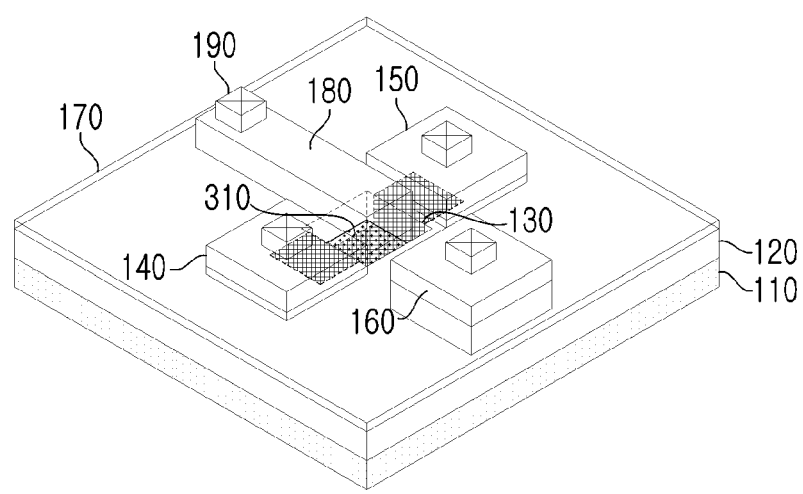
FIG. 4 is a view illustrating a photodetector according to a third exemplary embodiment of the present inventive concept.

FIG. 4 is a view illustrating a photodetector according to a third exemplary embodiment of the present inventive concept.

Referring to FIG. 4, a photodetector 300 according to the third embodiment of the present inventive concept has a structure including a substrate 110, an insulating layer 120, a graphene layer 130, a source electrode 140, a test electrode 150, a drain electrode 160, a gate insulating layer 170, and a gate electrode 180, like the photodetector 100 of the first embodiment, but may further include an intermediate layer 310 formed on the substrate 110.

The intermediate layer 310 may be formed between the substrate 110 and the graphene layer 130. More specifically, the insulating layer 120 may be formed on the substrate 110, and a portion of the insulating layer 120 may be etched to form the graphene layer 130, and thus the intermediate layer 310 may be formed on the exposed portion of the substrate 110. That is, the graphene layer 130 is formed on the intermediate layer 310 formed on the exposed portion of the substrate 110. Accordingly, a tunneling current may be formed between the substrate 110 and the graphene layer 130 due to the intermediate layer 310.

The material for forming the intermediate layer 310 may include one of $Al_2O_3$ and $TiO_2$ materials, and preferably, the intermediate layer 310 may be made of an $Al_2O_3$ material.

By inserting the intermediate layer 310 between the substrate 110 and the graphene layer 130 as described above, a dark current may decrease, and as the dark current decreases, there is an effect that photodetection efficiency may be improved. In addition, it may function as a defect passivation function protecting a surface of the substrate 110 formed of Si or Ge.

Figures 5A, 5B, 5C:
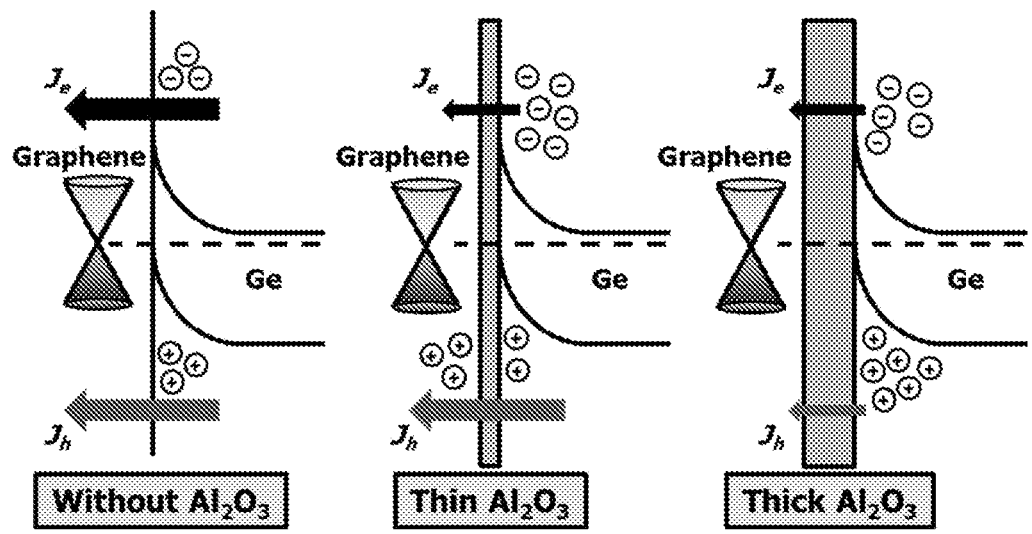
FIGS. 5A, 5B and 5C are band diagrams for describing the operation of the photodetector of the present inventive concept according to the insertion of an intermediate layer.

FIGS. 5A, 5B, and 5C are band diagrams for describing the operation of the photodetector of the present inventive concept according to the insertion of the intermediate layer.

Referring to FIGS. 5A, 5B, and 5C, FIG. 5A shows the movement of electrons and holes when the intermediate layer 310 is not inserted between the heterojunction components, the substrate 110 and the graphene layer 130, and FIGS. 5B and 5C show the movement of electrons and holes when the intermediate layer 310 made of an $Al_2O_3$ material is inserted between the substrate 110 and the graphene layer 130. However, the intermediate layer in FIG. 5B has a thickness at which a tunneling current is formed as compared with that in FIG. 5C.

As shown in FIG. 5B, it can be seen that electron injection decreases and hole injection increases due to the asymmetric tunneling effect at the interface by inserting the intermediate layer 310 between the heterojunction components, the substrate 110 and the graphene layer 130. That is, as an energy barrier increases due to the intermediate layer 310, a dark current decreases. Accordingly, by inserting the intermediate layer 310 between the substrate 110 and the graphene layer 130, a dark current may decrease, and as the dark current decreases, photodetection efficiency may be improved.

Figures 6A, 6B:
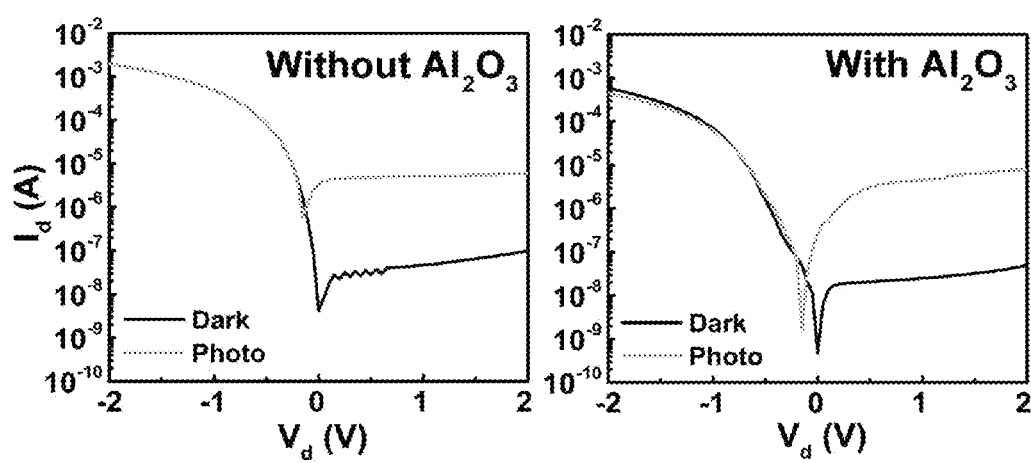
FIGS. 6A and 6B are graphs illustrating current-voltage characteristics of the photodetector of the present inventive concept according to whether the intermediate layer is inserted or not.

FIGS. 6A and 6B are graphs illustrating current-voltage characteristics of the photodetector of the present inventive concept according to whether the intermediate layer is inserted or not.

Here, FIG. 6A shows the case in which the intermediate layer is not inserted, and FIG. 6B shows the case in which the intermediate layer is inserted. Referring to FIGS. 6A and 6B, it can be seen that a dark current decreases more when the intermediate layer 310 is inserted than when the intermediate layer 310 is not inserted.

FIGS. 7A and 7B are graphs illustrating dark current characteristics and photoresponsivity according to the insertion of the intermediate layer of the present inventive concept.

Here, FIG. 7A shows a change in dark current density according to the number of $Al_2O_3$ (the intermediate layer 310) atomic layer deposition (ALD) cycles and FIG. 7B shows a change in photoresponsivity according to the number of $Al_2O_3$ ALD cycles.

As shown in FIG. 7A, it can be seen that the dark current density is reduced as the number of $Al_2O_3$ ALD cycles increases, and the dark current decreases about 10-fold when the number of cycles progresses to about 70 times.

In addition, as shown in FIG. 7B, it can be seen that photoresponsivity increases as the number of $Al_2O_3$ ALD cycles increases, and photoresponsivity increases 30% or more when the number of cycles progresses to about 70 times.

FIG. 8 is a view illustrating a photodetector according to a fourth exemplary embodiment of the present inventive concept.

Referring to FIG. 8, the fourth embodiment of the present inventive concept illustrates a graphene-semiconductor heterojunction photodetector in the form of an array.

That is, a graphene-semiconductor heterojunction photodetector 400 with the form of an array according to the fourth embodiment of the present inventive concept includes a substrate 110, an insulating layer 120, graphene layers 130 in the form of an array, source electrodes 140, a drain electrode 160, a gate insulating layer 170, and gate electrodes 180.

The substrate 110 may be a doped semiconductor substrate 110. For example, the substrate 110 may be a p-type or n-type impurity-doped substrate 110, and preferably, may be an n-type doped substrate 110. In addition, the substrate 110 may include Si or Ge, but is not limited thereto, and may have other semiconductor materials doped with an n-type impurity.

The insulating layer 120 is formed on the substrate 110 and serves as an insulating film for insulating the source electrodes 140, which will be described later. The insulating layer 120 is preferably made of silicon nitride, silicon oxide, or the like, but may be made of any material as long as it can achieve insulation between the source electrodes 140 formed on the insulating layer 120 and the substrate 110. In addition, the insulating layer 120 may be formed using a thermal oxidation method, a CVD method, a sputtering method, or the like.

The graphene layers 130 may be formed on the insulating layer 120 and the substrate 110. More specifically, in order to form the graphene layers 130 on the substrate 110 in the form of an array, portions of the insulating layer 120 may be etched through an etching process to expose portions of the substrate 110 in the form of an array. Accordingly, the graphene layers 130 are formed in an array form on the exposed portions of the substrate 110 such that each of the graphene layers 130 is formed to extend from the exposed portion of the substrate 110 to the insulating layer 120. At this point, due to a strong van der Waals force, the graphene layer 130 may be bonded to the substrate 110 without a separate process and an adhesive material.

Here, the graphene layers 130 formed on the portions of the substrate 110, which are exposed in the form of an array, may be formed to have different widths. That is, the graphene layers 130 formed on the substrate 110 may be formed to have areas with different sizes. Thus, the magnitude of the generated photocurrent may have a different value according to the area of the graphene layer 130 formed on the exposed portion of the substrate 110.

The graphene layer 130 is made of a material having a honeycomb-shaped thin planar structure in which carbon atoms are connected to each other, and has a high conductivity in a plane. Here, the carbon atoms are connected to each other to form one carbon atom layer, and the graphene layer 130 may be formed of a single carbon atom layer or multiple carbon atom layers. Here, the graphene layer 130 formed of a single layer may have a thickness equal to a thickness of one carbon atom. The carbon atom may have a 6-membered ring as a basic unit or may be formed in a 5- or 7-membered ring. That is, the single-layered graphene layer represents the graphene layer composed of a single layer, and the multilayered graphene layer represents the graphene layer composed of at least two, that is, multiple layers, but in the example embodiments of the present inventive concept, the graphene layer 130 is not limited thereto, and the single-layered graphene layer 130 may be used in consideration of the light transmittance of a graphene structure and non-occurrence of interlayer peeling.

The source electrode 140 may be formed on the insulating layer 120 to be in contact with one end of the graphene layer 130 formed on the insulating layer 120. This results in a form in which a portion of the graphene layer 130 is interposed between the source electrode 140 and the insulating layer 120, and the graphene layer 130 is electrically connected to the source electrode 140. Accordingly, the source electrode 140 may realize an equipotential with the graphene layer 130. In addition, since the source electrodes 140 are each formed on each of the graphene layers 130, the source electrode 140 may have the same array form as the graphene layer 130.

The source electrode 140 may include a metal or metal oxide such as gold (Au), silver (Ag), aluminum (Al), nickel (Ni), molybdenum (Mo), tungsten (W), indium tin oxide (ITO), indium zinc oxide (IZO), or the like as a conductive material, but the present inventive concept is not limited thereto.

The drain electrode 160 may be formed on a portion of the substrate 110. More specifically, a portion of the insulating layer 120 may be etched to expose a portion of the substrate 110 and a drain electrode 160 may be formed on the exposed portion of the substrate 110 so that the drain electrode 160 is formed to be adjacent to the source electrodes 140 and extend along the entire width of the array of source electrodes 140. Accordingly, the drain electrode 160 may be formed in a direction perpendicular to the source electrodes 140 and the graphene layers 130 in the form of an array.

That is, a structure may be implemented in which the drain electrode 160 is provided in a form physically separated from the graphene layer 130 so that current generated in the graphene layer 130 is not directly transmitted to the drain electrode 160.

Here, the drain electrode 160 is formed adjacent to the source electrodes 140 in a direction perpendicular to the source electrodes 140 such that one drain electrode 160 extends along the entire width of the array of source electrodes 140, so that the drain electrode 160 may be commonly used in the array structure. Accordingly, the array type photodetector according to the present inventive concept has an effect in which a light-receiving area per unit area of the photodetector increases by commonly using the drain electrode 160.

In addition, a desired source electrode 140 may be selectively wired to the drain electrode 160. That is, the source electrode 140 desired by a user among the source electrodes 140 may be selected and conveniently wired to the adjacent drain electrode 160.

As an example, when the graphene layers 130 are formed on the portions of the substrate 110, which are exposed to form the graphene layers 130 in the form of an array, to have different areas so that the magnitude of the photocurrent generated for each array is different, the source electrodes 140 connected to the drain electrode 160 may have different operating points. That is, the operating points may be arbitrarily changed according to the source electrode 140 connected to the drain electrode 160.

Further, a structure may be implemented in which current generated at the interface between the graphene layer 130 and the substrate 110 is transmitted to the drain electrode 160 through the substrate 110 made of a semiconductor material. However, when the drain electrode 160 is formed one by one in a direction in which the graphene layers 130 are formed, only electrons or holes among electron-hole pairs formed at an end portion of the graphene layer 130 are transmitted to the drain electrode 160 through the substrate 110 made of a semiconductor material, and thus it is difficult to ensure high photosensitivity.

However, in the present inventive concept, since the drain electrode 160 is formed at a side surface of the graphene layer 130 such that the drain electrode 160 is in a direction perpendicular to the graphene layers 130 in the form of an array, charges formed at the central region portion of the graphene layer 130 are transmitted to the drain electrode 160 through the substrate 110, so that high photosensitivity may be secured, and a high output voltage may be secured for the applied light.

The drain electrode 160 may include a metal or metal oxide such as gold (Au), silver (Ag), aluminum (Al), nickel (Ni), molybdenum (Mo), tungsten (W), indium tin oxide (ITO), indium zinc oxide (IZO), or the like as a conductive material, but the present inventive concept is not limited thereto.

The gate insulating layer 170 may be formed on the insulating layer 120. That is, the gate insulating layer 170 may be formed on the entire upper surface of the insulating layer 120 including the graphene layers 130 in the form of an array and the exposed portions of the substrate 110. Accordingly, the gate insulating layer 170 may simultaneously perform a passivation function for protecting the graphene layers 130 in the form of an array and the exposed portions of the substrate 110 from the outside in addition to a function for insulating the gate electrode 180. In addition, the gate insulating layer 170 needs to have light transmittance for the applied light and thus is preferably made of one of $Al_2O_3$ and $HfO_2$ which are transparent materials.

Here, the gate insulating layer 170 may be formed on the entire upper surface of the insulating layer 120 and may be formed to partially expose an upper portion of each of the source electrodes 140 and the drain electrode 160. This is to form a separate wire 190 through the exposed region.

The gate electrodes 180 may be formed in an array form to correspond to the source electrodes 140 on the gate insulating layer 170. The gate electrode 180 is required to include a light-transmitting material and have conductivity. Accordingly, it is desirable that the gate electrode 180 includes a ZnO material.

In the structure illustrated in FIG. 8, the graphene layer 130 has a single-layer structure, and thus a band diagram has a Dirac cone shape. In addition, a Schottky junction is formed between the graphene layer 130 and the substrate 110. In particular, since the substrate 110 is doped with an n-type impurity, majority carriers in the substrate 110 become electrons.

When the voltage applied through the gate electrode 180 has a negative value, the Dirac point of the graphene layer 130 falls below the Fermi level of the gate electrode 180, and the Fermi level of the substrate 110 falls below the Dirac point. Accordingly, majority carriers in the graphene layer 130 become holes, and majority carriers in the substrate 110 become electrons, so that electrons of a conduction band induced in the substrate 110 or the graphene layer 130 may rapidly move to the drain electrode 160 to form a photocurrent. Such a photocurrent is based on the assumption that light applied from the outside is incident on the substrate 110 through the gate electrode 180, the gate insulating layer 170, and the graphene layer 130. That is, in the electron-hole pairs generated by the light incident on the substrate 110 and the graphene layer 130, the electrons move to the drain electrode 160 through the substrate 110, and the holes move to the graphene layer 130.

Further, when the voltage applied through the gate electrode 180 has a positive value, the Dirac point of the graphene layer 130 is set to be higher or equal to the Fermi level of the gate electrode 180. In addition, the Fermi level of the substrate 110 rises relative to the Dirac point of the graphene layer 130. The probability that the holes generated in the substrate 110 move to the graphene layer 130 is reduced due to the increase in the Fermi level. Complementary to this, the probability that electrons generated in the graphene layer 130 or the substrate 110 move to the drain electrode 160 is also reduced. Accordingly, the phenomenon in which the photocurrent also decreases due to the incidence of light occurs.

In the present example embodiment, the Dirac point corresponds to the Fermi level of the graphene layer 130 and the substrate 110 when no bias is applied to the gate electrode 180, which has the same value as the Fermi level of the gate electrode 180.

In addition, in FIG. 8, it is desirable that the graphene layers 130 in the form of an array are physically separated from the drain electrode 160. When the graphene layer 130 and the drain electrode 160 are in physical contact with each other on the substrate 110, the Schottky barrier between the graphene layer 130 and the substrate 110 may lose the current control function, and there arises a problem that the carriers generated on the substrate 110 directly move to the drain electrode 160. In addition, as the probability that the holes in the graphene layer 130 move to the drain electrode 160 and recombine with electrons is increased, there arises a problem that the formation of the photocurrent is practically impossible.

Figure 9:
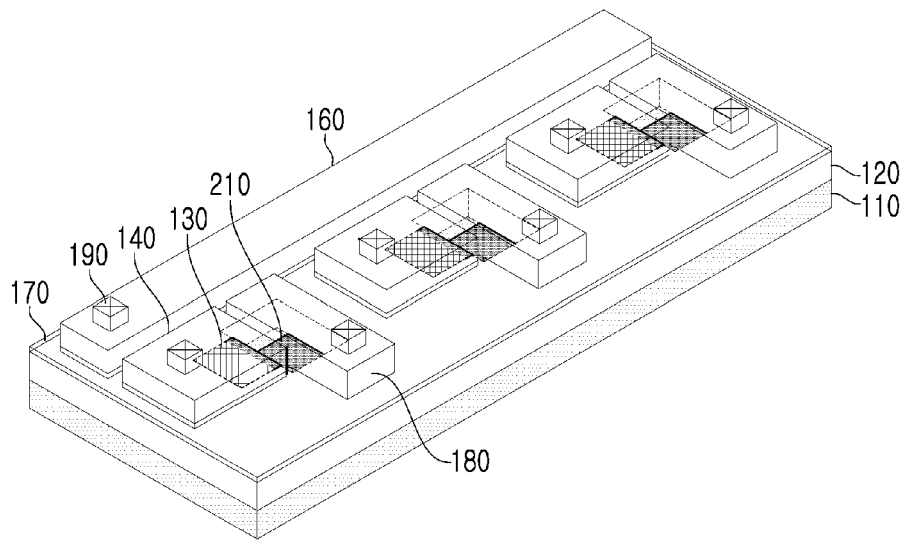
FIG. 9 is a view illustrating a photodetector according to a fifth exemplary embodiment of the present inventive concept.

FIG. 9 is a view illustrating a photodetector according to a fifth exemplary embodiment of the present inventive concept.

Referring to FIG. 9, a photodetector 500 according to the fifth embodiment of the present inventive concept has a structure including a substrate 110, an insulating layer 120, graphene layers 130 in the form of an array, source electrodes 140, a drain electrode 160, a gate insulating layer 170, and gate electrodes 180, like the photodetector 400 of the fourth embodiment, but includes the graphene layers 130 having a surface doped with a dopant. That is, the graphene layers 130 in the form of an array may each include a dopant layer 210 formed on a surface of the graphene layer 130.

As shown in FIG. 9, the dopant layer 210 formed on a portion of the graphene layer 130 may be formed on an exposed portion of the graphene layer 130 except for a portion thereof in contact with the source electrode 140 when the graphene layer 130 is formed on the substrate 110 and the insulating layer 120, and the source electrode 140 is formed on the graphene layer 130.

The dopant layer 210 is manufactured, for example, by applying a dopant solution over the graphene layer 130 at a corresponding site through bar-coating or spin-coating in dry air, and vacuum drying. Since the dopant layer 210 is in contact with the graphene layer 130, dopants located near the interface are chemically adsorbed on and doped (chemically doped) into the graphene layer 130.

The dopant layer 210 may be doped with a p-type or n-type impurity. As an example, a p-type doped material may include PAA, and an n-type doped material may include PEI.

Accordingly, when the dopant layer 210 doped with a p-type impurity is formed on the graphene layer 130, it may operate as a p-type semiconductor, and when the dopant layer 210 doped with an n-type impurity is formed on the graphene layer 130, it may operate as an n-type semiconductor.

Figure 10:
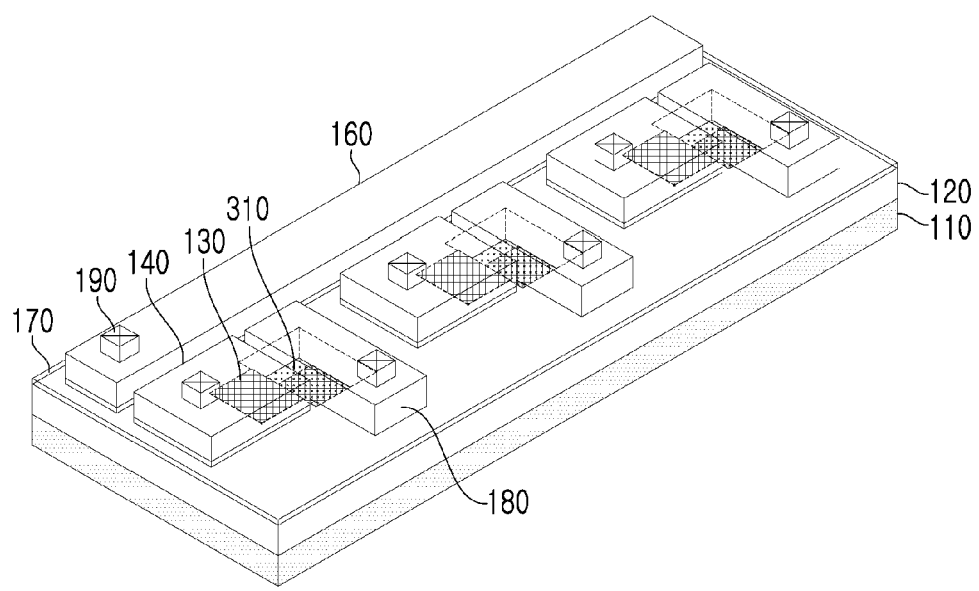
FIG. 10 is a view illustrating a photodetector according to a sixth exemplary embodiment of the present inventive concept.

FIG. 10 is a view illustrating a photodetector according to a sixth exemplary embodiment of the present inventive concept.

Referring to FIG. 10, a photodetector 600 according to the sixth embodiment of the present inventive concept has a structure including a substrate 110, an insulating layer 120, graphene layers 130 in the form of an array, source electrodes 140, a drain electrode 160, a gate insulating layer 170, and gate electrodes 180, like the photodetector 400 of the fourth embodiment, but may further include intermediate layers 310 formed on the substrate 110.

The intermediate layer 310 may be formed between the substrate 110 and the graphene layer 130. More specifically, the insulating layer 120 may be formed on the substrate 110, and portions of the insulating layer 120 may be etched to form the graphene layers 130 in the form of an array, and thus the intermediate layers 310 may be formed on portions of the substrate 110, which are exposed in the form of an array. That is, the graphene layers 130 in the form of an array are each formed on each of the intermediate layers 310 formed on the exposed portions of the substrate 110. Accordingly, a tunneling current may be formed between the substrate 110 and the graphene layer 130 due to the intermediate layer 310.

The material for forming the intermediate layer 310 may include one of $Al_2O_3$ and $TiO_2$ materials, and preferably, the intermediate layer 310 may be made of an $Al_2O_3$ material.

By inserting the intermediate layer 310 between the substrate 110 and the graphene layer 130 as described above, a dark current may decrease, and as the dark current decreases, there is an effect that photodetection efficiency may be improved. In addition, it may function as a defect passivation function protecting a surface of the substrate 110 formed of Si or Ge.

FIGS. 11 to 18 are views illustrating a method of manufacturing the photodetector according to the first embodiment of the present inventive concept.

Figure 11:
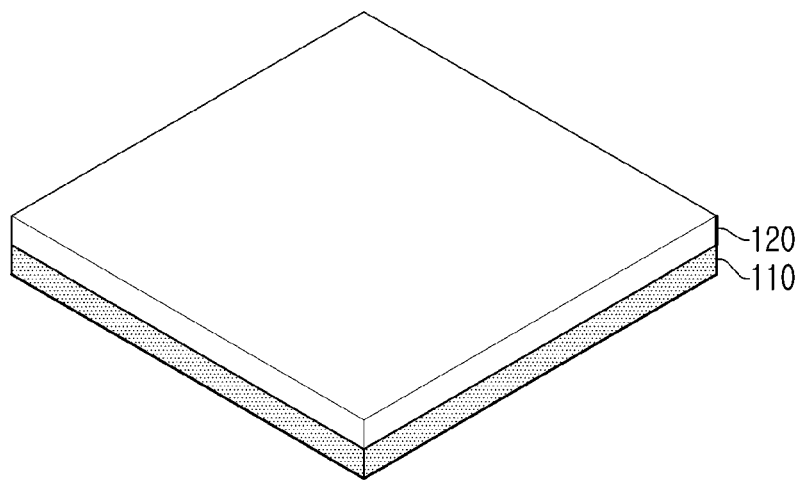
FIGS. 11 to 18 are views illustrating a method of manufacturing the photodetector according to the first embodiment of the present inventive concept.

First, referring to FIG. 11, an insulating layer 120 is formed on a substrate 110. The substrate 110 may be a doped semiconductor substrate 110. For example, the substrate 110 may include Si or Ge, but is not limited thereto, and may have other semiconductor materials doped with an n-type impurity. It is desirable that a surface of the substrate 110 is pre-cleaned. Specifically, ultrasonic cleaning is performed on the substrate 110 using hydrochloric acid peroxide (HPM), sulfuric acid peroxide (SPM), ammonia peroxide (APM), diluted hydrofluoric acid (DHF), or the like. Through such a cleaning process, the flatness of a surface of the substrate 110 may be improved, and abrasive particles remaining on the surface of the substrate 110 may be removed.

The insulating layer 120 formed on the substrate 110 is preferably made of silicon nitride, silicon oxide, or the like, and a thermal oxidation method, a CVD method, a sputtering method, or the like may be used to form the insulating layer 120 on the substrate 110.

Figure 12:
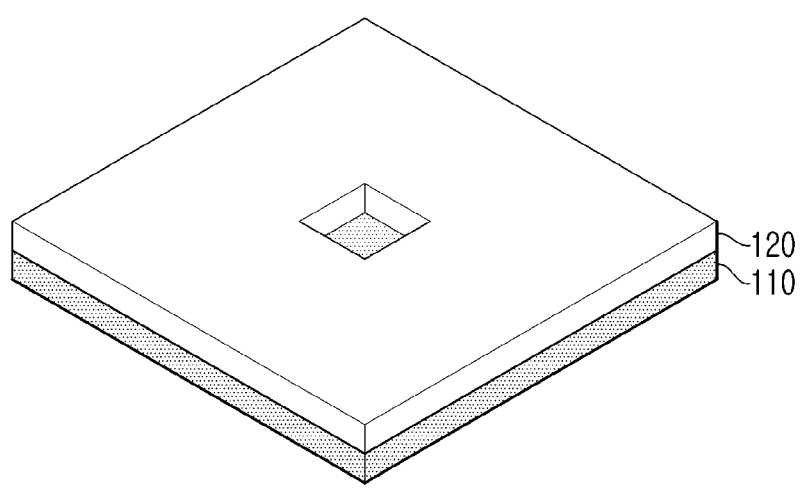

Referring to FIG. 12, the insulating layer 120 is selectively etched to expose a portion of the substrate 110 therebelow. A graphene layer 130 may be formed on the exposed portion of the substrate 110 through a subsequent process, and a gate insulating layer 170 may be formed on the graphene layer 130 in a buried form.

Figure 13:
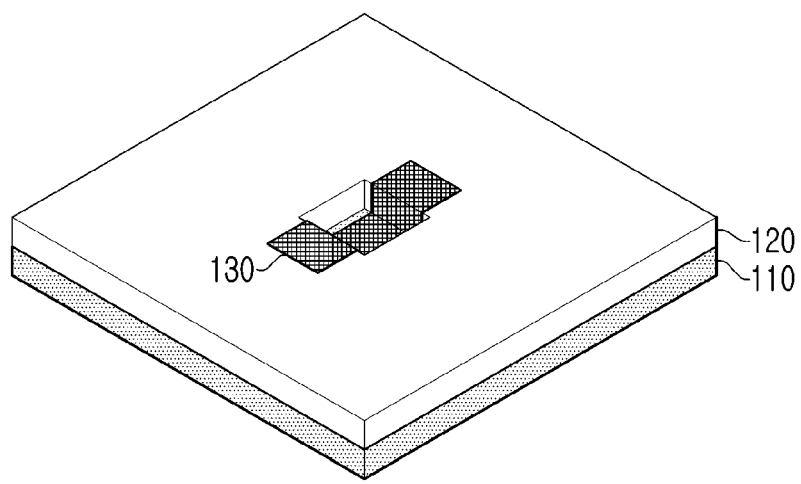

Referring to FIG. 13, the graphene layer 130 is formed to extend from the substrate 110 to the insulating layer 120. That is, the graphene layer 130 may be formed to extend from the exposed portion of the substrate 110 to the insulating layer 120.

The graphene layer 130 is formed by depositing graphene on a catalyst substrate (not shown). The deposition is performed using a thermal CVD method, a plasma CVD method, or the like. In the thermal CVD method, a carbon source material (a material containing carbon atoms) supplied on a surface of the catalyst substrate is heated to form graphene. In the plasma CVD method, a carbon source material is plasmaized to form graphene.

The material of the catalyst substrate is not particularly limited but may include, for example, nickel, iron, copper, and the like. Preferably, copper may be used as the material of the catalyst substrate. This is to form single-layer graphene with high adhesion. The graphene may be deposited on the surface of the catalyst substrate by supplying a carbon source material (methane or the like) to the surface of the catalyst substrate and heating the catalyst substrate to a temperature higher than or equal to the temperature at which graphene is formed.

Thereafter, the graphene layer 130 is transferred onto the substrate 110 and the insulating layer 120. A transfer method is not particularly limited but may be performed as described below. A 4% polymethyl methacrylate (PMMA) solution is applied on the graphene layer 130 through spin coating (2000 rpm, 40 seconds), followed by baking at 130° C. for five minutes. Accordingly, a resin layer including PMMA is formed on the graphene layer 130. Next, the catalyst substrate is etched (removed) using a 1M iron chloride solution. After the graphene layer 130 on the resin layer is cleaned with ultrapure water, the cleaned graphene layer 130 may be transferred onto the substrate 110 and the insulating layer 120 and naturally dried. After drying, the PMMA on the graphene layer 130 is dissolved by acetone and removed. The acetone may be removed by vacuum drying under the heat of about 100° C. The PMMA may also be removed by heating (annealing) and decomposing the PMMA in a hydrogen atmosphere at about 400° C.

In FIG. 13, the graphene layer 130 is provided in a patterned form. To this end, the graphene layer 130 pre-patterned on a transfer substrate may be provided in a transferred form, and the graphene layer 130 may be selectively etched after the graphene layer 130 is transferred, thereby providing the graphene layer 130 in a patterned form. In addition, in FIG. 13, the insulating layer 120 and the exposed portion of the substrate 110 are illustrated as having a substantially vertical profile, and the graphene layer 130 is illustrated as being formed along the vertical profile. However, when selective etching is actually performed, side surfaces of the exposed portion of the substrate 110 and the etched insulating layer 120 may be provided in an inclined form with a predetermined angle, and the graphene layer 130 composed of a single layer or 2 to 5 layers may be easily formed along the profile by being bonded to a surface of the profile.

Figure 14:
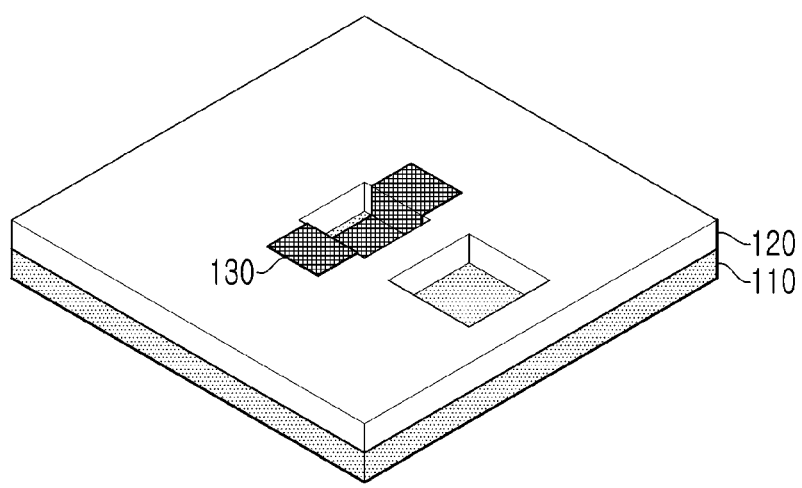

Referring to FIG. 14, a region in which a drain electrode 160 is to be formed is defined by selectively etching the structure illustrated in FIG. 13 to expose a portion of the substrate 110 therebelow. In addition, the operation of FIG. 14 defining the region in which the drain electrode 160 is formed may be performed simultaneously with the operation of FIG. 12. That is, the region in which the graphene layer 130 is to be formed and the region in which the drain electrode 160 is to be formed may be simultaneously formed through a single selective etching process.

Figure 15:
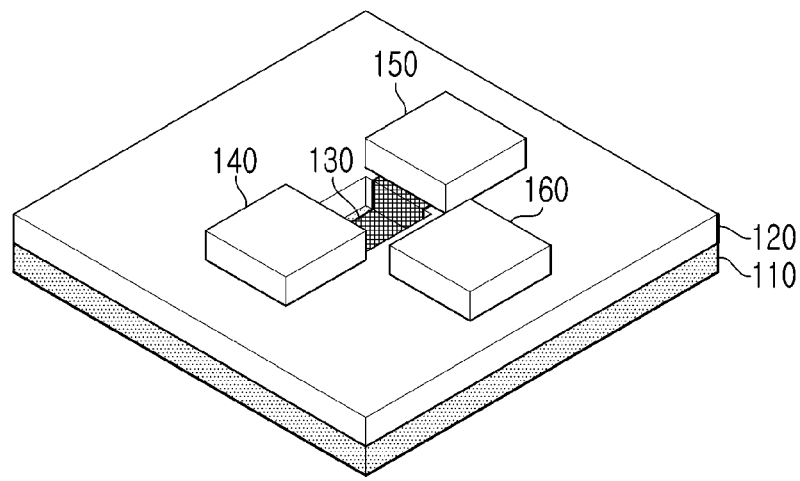

Referring to FIG. 15, a source electrode 140 and a test electrode 150 may be formed on the graphene layer 130, and the drain electrode 160 may be formed on the substrate 110.

Here, the source electrode 140 and the test electrode 150 may be formed on one end and the other end of the graphene layer 130, which are formed on the insulating layer 120, respectively. Here, the test electrode 150 may be used as an electrode for evaluating a device to check whether the device is normal or not.

Here, the drain electrode 160 may be formed in a direction perpendicular to the source electrode 140 and the test electrode 150. Accordingly, the drain electrode 160 may be provided in a form physically separated from the graphene layer 130.

Each of the electrodes may include a metal or metal oxide such as gold (Au), silver (Ag), aluminum (Al), nickel (Ni), molybdenum (Mo), tungsten (W), indium tin oxide (ITO), indium zinc oxide (IZO), or the like as a conductive material, but is not limited thereto, and may be formed through an i-line photolithography process.

Figure 16:
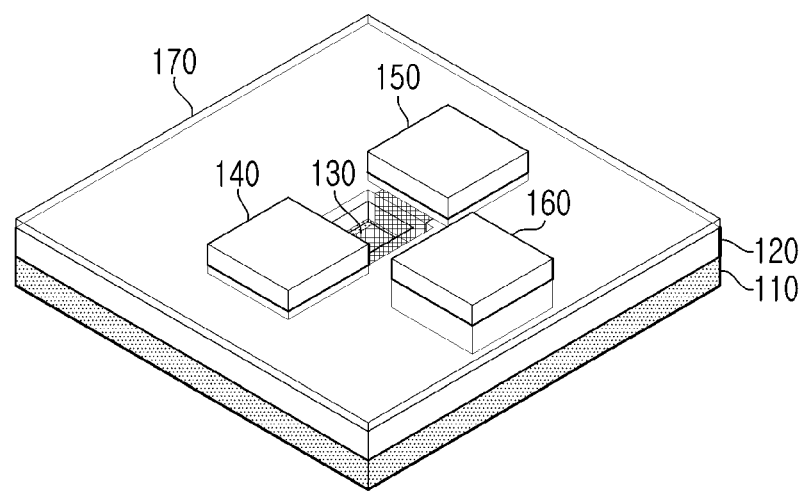

Referring to FIG. 16, the gate insulating layer 170 may be formed on the entire surface of the insulating layer 120. The gate insulating layer 170 may simultaneously perform a passivation function for protecting the graphene layer 130 and the exposed portion of the substrate 110 from the outside in addition to a function for insulating the gate electrode 180. Here, the gate insulating layer 170 may be formed on the entire upper surface of the insulating layer 120 and may be formed to partially expose an upper portion of each of the source electrode 140, the test electrode 150, and the drain electrode 160.

In addition, the gate insulating layer 170 needs to have light transmittance for the applied light and thus is preferably made of one of $Al_2O_3$ and $HfO_2$ which are transparent materials.

Figure 17:
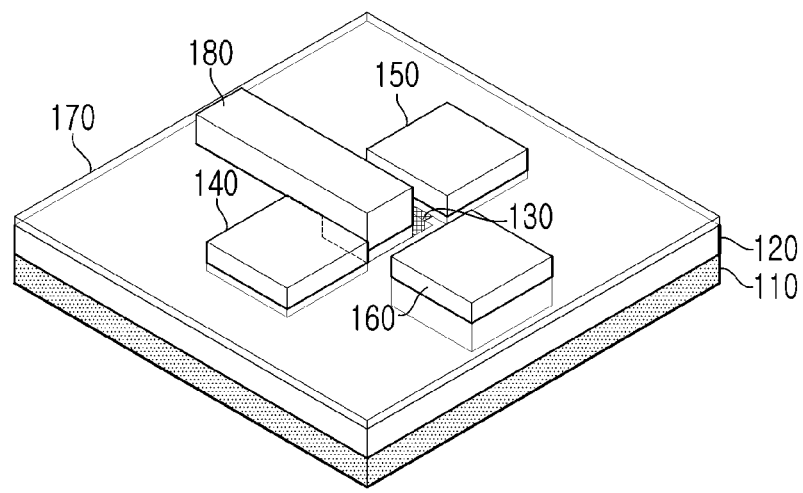

Referring to FIG. 17, a gate electrode 180 may be formed on the gate insulating layer 170. The gate electrode 180 may be formed in a direction facing the drain electrode 160. In addition, the gate electrode 180 is required to include a light-transmitting material and have conductivity. Accordingly, it is desirable that the gate electrode 180 includes a ZnO material.

Figure 18:
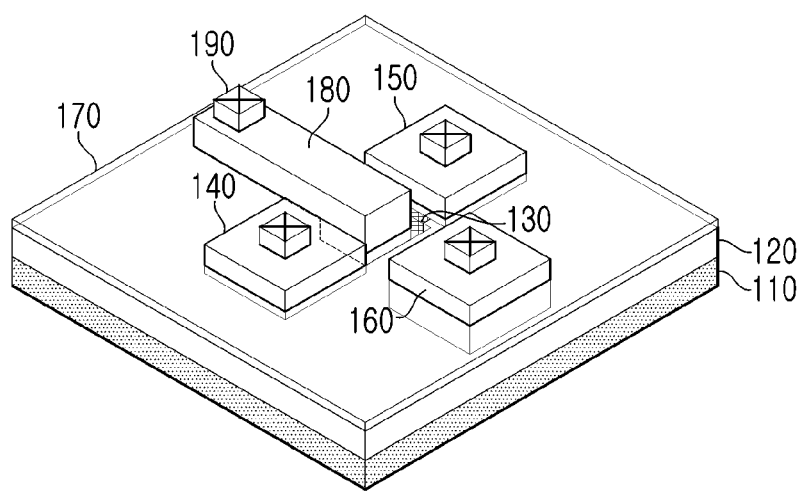

Referring to FIG. 18, an operation of forming separate wires 190 at an upper portion of the gate electrode 180, and upper portions of the source electrode 140, the test electrode 150, and the drain electrode 160, which are exposed from the gate insulating layer 170, may be further included.

Figure 19:
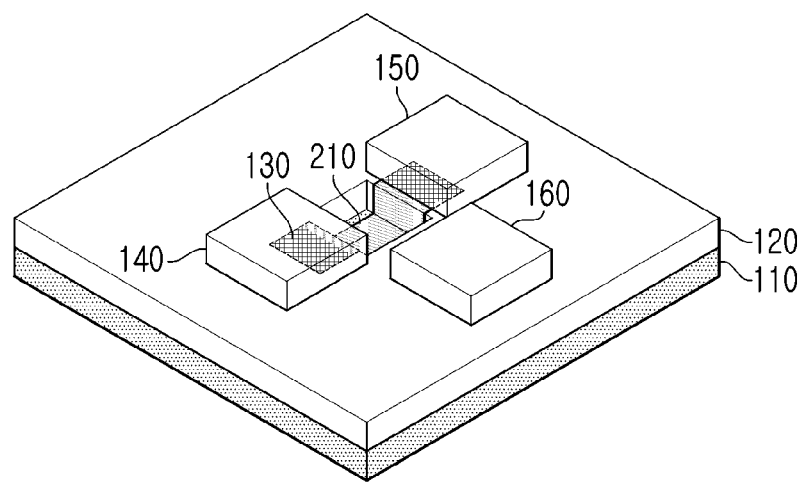
FIG. 19 is a view illustrating a method of manufacturing the photodetector according to the second embodiment of the present inventive concept.

FIG. 19 is a view illustrating a method of manufacturing the photodetector according to the second embodiment of the present inventive concept.

Referring to FIG. 19, a manufacturing method of the photodetector 200 according to the second embodiment of the present inventive concept is the same as the manufacturing method of the photodetector 100 according to the first embodiment until after the operations of the manufacturing method illustrated with reference to FIGS. 11 to 15. That is, the manufacturing method has the same operations until after the operations of forming an insulating layer 120 on a substrate 110, forming a graphene layer 130 on the substrate 110 and the insulating layer 120, and then forming a source electrode 140, a test electrode 150, and a drain electrode 160 on the graphene layer 130 and the substrate 110. Thereafter, forming a dopant layer 210 on an exposed portion of the graphene layer 130 may be further included. That is, as shown in FIG. 19, an exposed surface of the graphene layer 130 except for portions of the graphene layer 130, on which the source electrode 140 and the test electrode 150 are formed, is doped with an n-type or p-type impurity.

The dopant layer 210 is manufactured, for example, by applying a dopant solution over the graphene layer 130 at a corresponding site through bar-coating or spin-coating in dry air, and vacuum drying. Since the dopant layer 210 is in contact with the graphene layer 130, dopants located near the interface are chemically adsorbed on and doped (chemically doped) into the graphene layer 130.

As an example, the dopant layer 210 may be doped with a p-type material (PAA) or an n-type material (PEI). That is, when the dopant layer 210 doped with a p-type impurity is formed on the graphene layer 130, it may operate as a p-type semiconductor, and when the dopant layer 210 doped with an n-type impurity is formed on the graphene layer 130, it may operate as an n-type semiconductor.

Operations after the above-described operation of forming the dopant layer 210 on the exposed surface of the graphene layer 130 are the same as those illustrated with reference to FIGS. 16 to 18 in the method of manufacturing the photodetector 100 according to the first embodiment.

Figure 20:
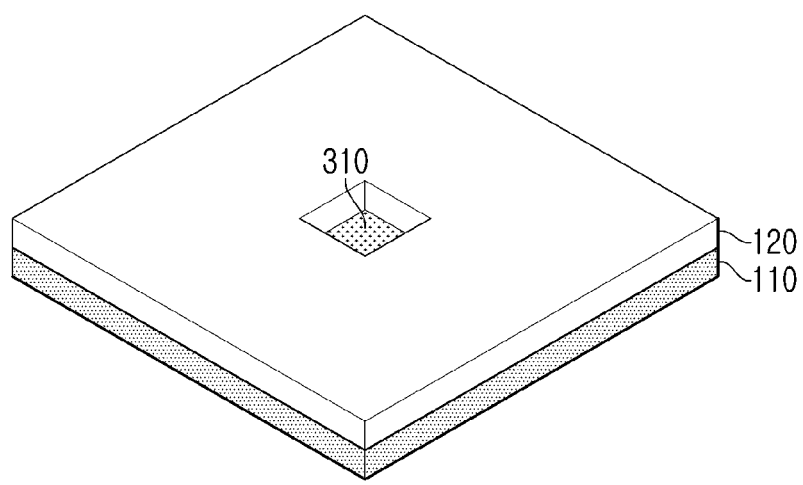
FIG. 20 is a view illustrating a method of manufacturing the photodetector according to the third embodiment of the present inventive concept.

FIG. 20 is a view illustrating a method of manufacturing the photodetector according to the third embodiment of the present inventive concept.

Referring to FIG. 20, a manufacturing method of the photodetector 300 according to the third embodiment of the present inventive concept is the same as the manufacturing method of the photodetector 100 according to the first embodiment until after the operations of the manufacturing method illustrated with reference to FIGS. 11 to 12. That is, the manufacturing method has the same operations until after the operations of forming an insulating layer 120 on a substrate 110 and exposing a portion of the substrate 110 using a process of etching the insulating layer 120 to form a graphene layer 130 on the exposed portion of the substrate 110. Thereafter, forming an intermediate layer 310 on the exposed portion of the substrate 110 may be further included.

That is, the intermediate layer 310 may be formed between the substrate 110 and the graphene layer 130. In addition, a tunneling current may be formed between the substrate 110 and the graphene layer 130 due to the insertion of the intermediate layer 310. The material for forming the intermediate layer 310 may include one of $Al_2O_3$ and $TiO_2$ materials, and preferably, the intermediate layer 310 may be made of an $Al_2O_3$ material.

By inserting the intermediate layer 310 between the heterojunction components, the substrate 110 and the graphene layer 130, as described above, due to the asymmetric tunneling effect at the interface, electron injection may decrease and hole injection may increase. Accordingly, an energy barrier increases by the intermediate layer 310 to decrease a dark current, and as the dark current decreases, there is an effect that photodetection efficiency may be improved.

Operations after the above-described operation of forming the intermediate layer 310 on the exposed portion of the substrate 110 are the same as those illustrated with reference to FIGS. 13 to 18 in the method of manufacturing the photodetector 100 according to the first embodiment.

FIGS. 21 to 28 are views illustrating a method of manufacturing the graphene-semiconductor heterojunction photodetector in the form of an array according to the fourth embodiment of the present inventive concept.

Figure 21:
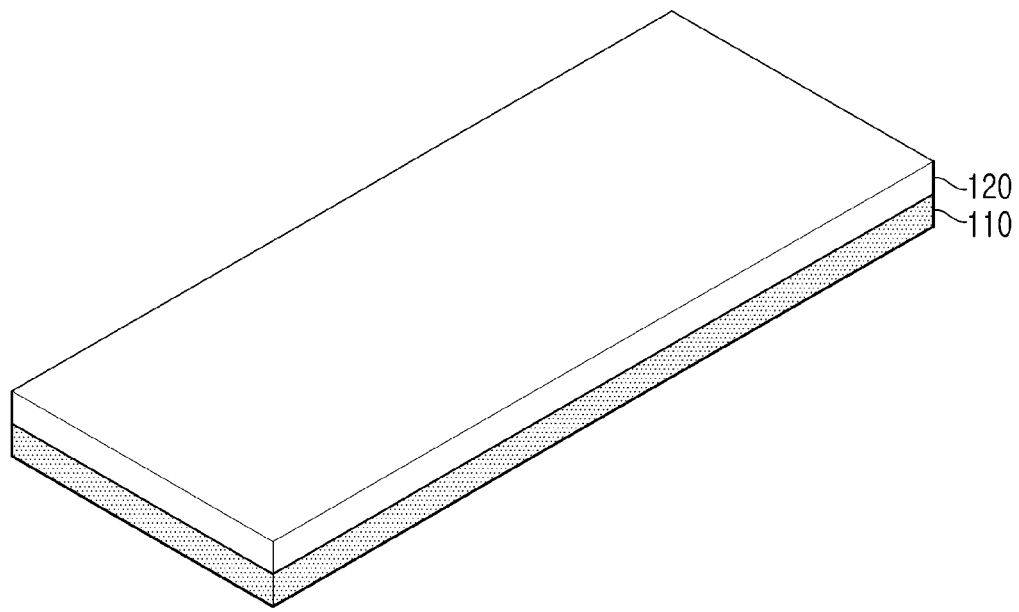
FIGS. 21 to 28 are views illustrating a method of manufacturing the photodetector according to the fourth embodiment of the present inventive concept.

First, referring to FIG. 21, an insulating layer 120 is formed on a substrate 110. The substrate 110 may be a doped semiconductor substrate 110. For example, the substrate 110 may include Si or Ge, but is not limited thereto, and may have other semiconductor materials doped with an n-type impurity. It is desirable that a surface of the substrate 110 is pre-cleaned. Specifically, ultrasonic cleaning is performed on the substrate 110 using HPM, SPM, APM, DHF, or the like. Through such a cleaning process, the flatness of a surface of the substrate 110 may be improved, and abrasive particles remaining on the surface of the substrate 110 may be removed.

The insulating layer 120 formed on the substrate 110 is preferably made of silicon nitride, silicon oxide, or the like, and a thermal oxidation method, a CVD method, a sputtering method, or the like may be used to form the insulating layer 120 on the substrate 110.

Figure 22:
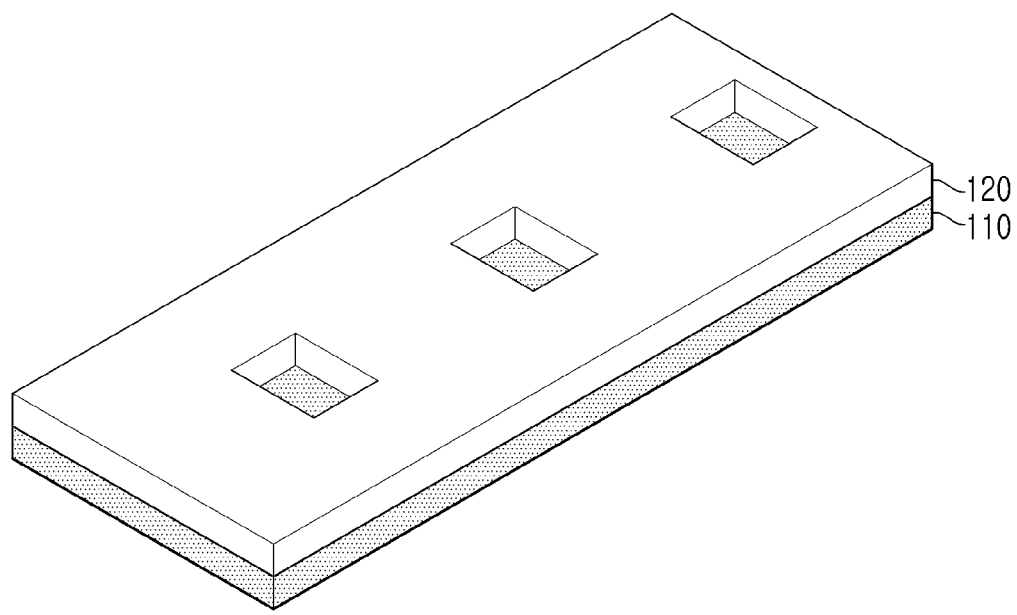

Referring to FIG. 22, the insulating layer 120 is selectively etched to expose portions of the substrate 110 therebelow. Here, the exposed portions of the substrate 110 may be formed in the form of an array in the insulating layer 120. Graphene layers 130 may be formed on the exposed portions of substrate 110 through a subsequent process, and a gate insulating layer 170 may be formed on the graphene layer 130 in a buried form.

Figure 23:
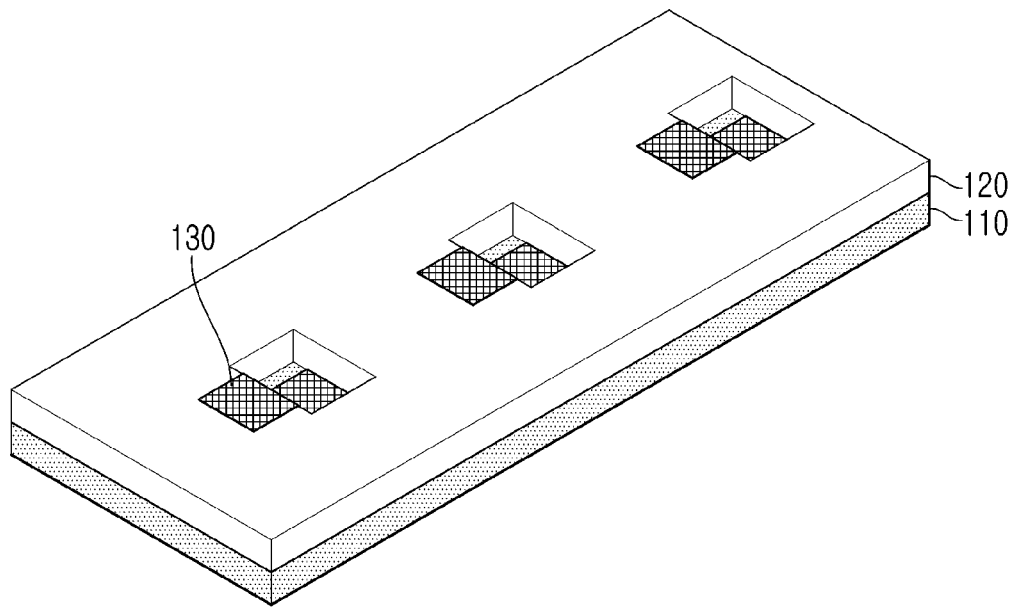

Referring to FIG. 23, the graphene layer 130 is formed to extend from the substrate 110 to the insulating layer 120. That is, the graphene layers 130 may each be formed to extend from the exposed portion of the substrate 110 to the insulating layer 120 and may be formed in the form of an array.

Here, the graphene layers 130 formed on the portions of the substrate 110, which are exposed in the form of an array, may be formed to have different widths. That is, the graphene layers 130 formed on the substrate 110 may be formed to have areas with different sizes.

The graphene layer 130 is formed by depositing graphene on a catalyst substrate (not shown). The deposition is performed using a thermal CVD method, a plasma CVD method, or the like. In the thermal CVD method, a carbon source material (a material containing carbon atoms) supplied on a surface of the catalyst substrate is heated to form graphene. In the plasma CVD method, a carbon source material is plasmaized to form graphene.

The material of the catalyst substrate is not particularly limited but may include, for example, nickel, iron, copper, and the like. Preferably, copper may be used as the material of the catalyst substrate. This is to form single-layer graphene with high adhesion. The graphene may be deposited on the surface of the catalyst substrate by supplying a carbon source material (methane or the like) to the surface of the catalyst substrate and heating the catalyst substrate to a temperature higher than or equal to the temperature at which graphene is formed.

Thereafter, the graphene layer 130 is transferred onto the substrate 110 and the insulating layer 120. A transfer method is not particularly limited but may be performed as described below. A 4% polymethyl methacrylate (PMMA) solution is applied on the graphene layer 130 through the spin coating (2000 rpm, 40 seconds), followed by baking at 130° C. for five minutes. Accordingly, a resin layer including PMMA is formed on the graphene layer 130. Next, the catalyst substrate is etched (removed) using a 1M iron chloride solution. After the graphene layer 130 on the resin layer is cleaned with ultrapure water, the cleaned graphene layer 130 may be transferred onto the substrate 110 and the insulating layer 120 and naturally dried. After drying, the PMMA on the graphene layer 130 is dissolved by acetone and removed. The acetone may be removed by vacuum drying under the heat of about 100° C. The PMMA may also be removed by heating (annealing) and decomposing the PMMA in a hydrogen atmosphere at about 400° C.

In FIG. 23, the graphene layer 130 is provided in a patterned form. To this end, the graphene layer 130 pre-patterned on a transfer substrate may be provided in a transferred form, and the graphene layer 130 may be selectively etched after the graphene layer 130 is transferred, thereby providing the graphene layer 130 in a patterned form. In addition, in FIG. 23, the insulating layer 120 and the exposed portion of the substrate 110 are illustrated as having a substantially vertical profile, and the graphene layer 130 is illustrated as being formed along the vertical profile. However, when selective etching is actually performed, side surfaces of the exposed portion of the substrate 110 and the etched insulating layer 120 may be provided in an inclined form with a predetermined angle, and the graphene layer 130 composed of a single layer or 2 to 5 layers may be easily formed along the profile by being bonded to a surface of the profile.

Figure 24:
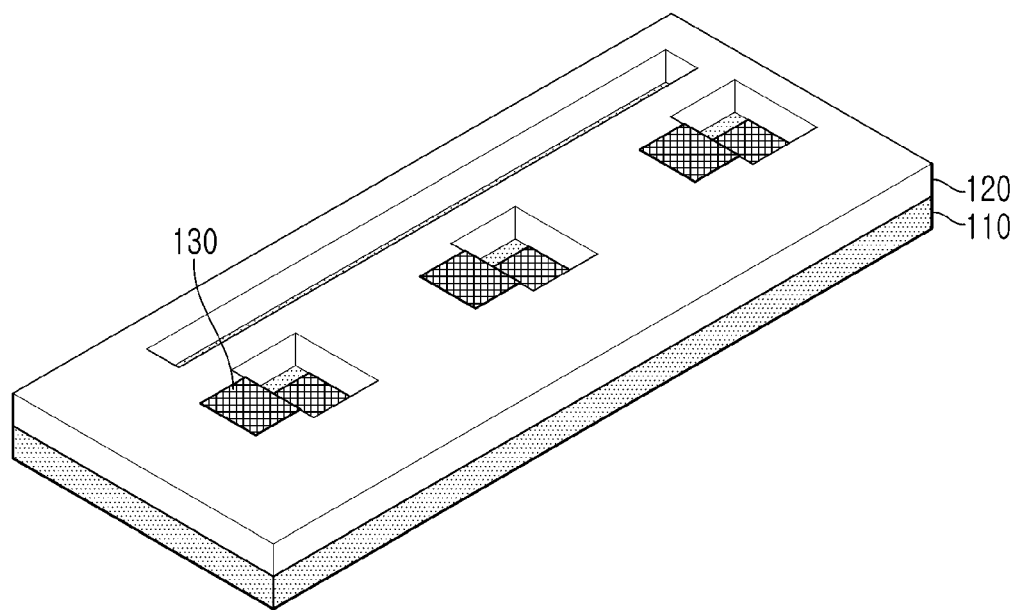

Referring to FIG. 24, a region in which drain electrode 160 is to be formed is defined by selectively etching the structure illustrated in FIG. 23 to expose a portion of the substrate 110 therebelow. In addition, the operation of FIG. 24 defining the region in which the drain electrode 160 is formed may be performed simultaneously with the operation of FIG. 22. That is, the region in which the graphene layer 130 is to be formed and the region in which the drain electrode 160 is to be formed may be simultaneously formed through a single selective etching process.

Figure 25:
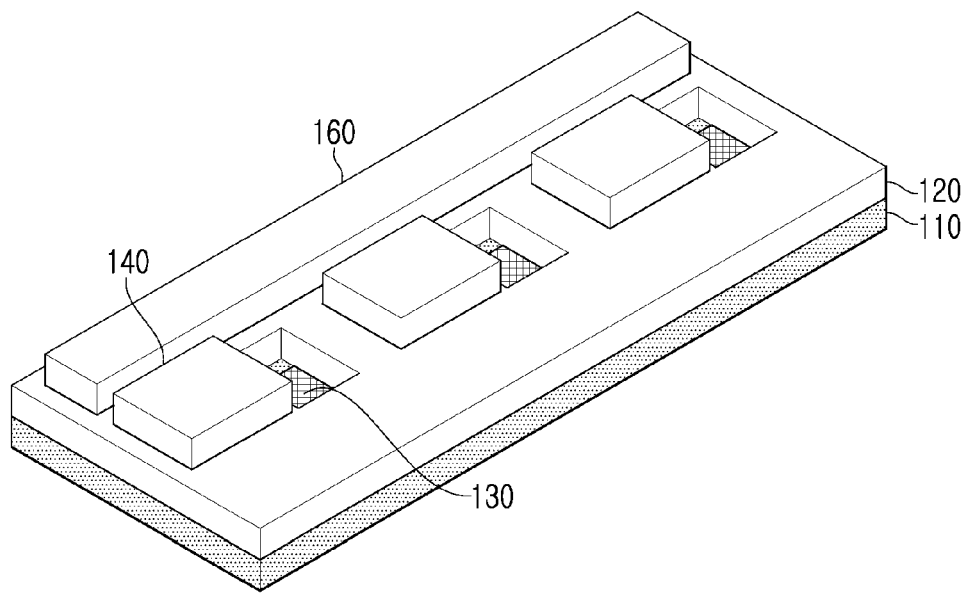

Referring to FIG. 25, source electrodes 140 are each formed on each of the graphene layers 130 in the form of an array, and the drain electrode 160 may be formed in a direction perpendicular to the graphene layers 130 in the form of an array. Here, the source electrodes 140 may each be formed on one end of each of the graphene layers 130, which is formed on the insulating layer 120.

Here, the drain electrode 160 may be formed in a direction perpendicular to the source electrodes 140 and the graphene layers 130. Accordingly, the drain electrode 160 may be provided in a form physically separated from the graphene layer 130.

Each of the electrodes may include a metal or metal oxide such as gold (Au), silver (Ag), aluminum (Al), nickel (Ni), molybdenum (Mo), tungsten (W), indium tin oxide (ITO), indium zinc oxide (IZO), or the like as a conductive material, but is not limited thereto, and may be formed through an i-line photolithography process.

Figure 26:
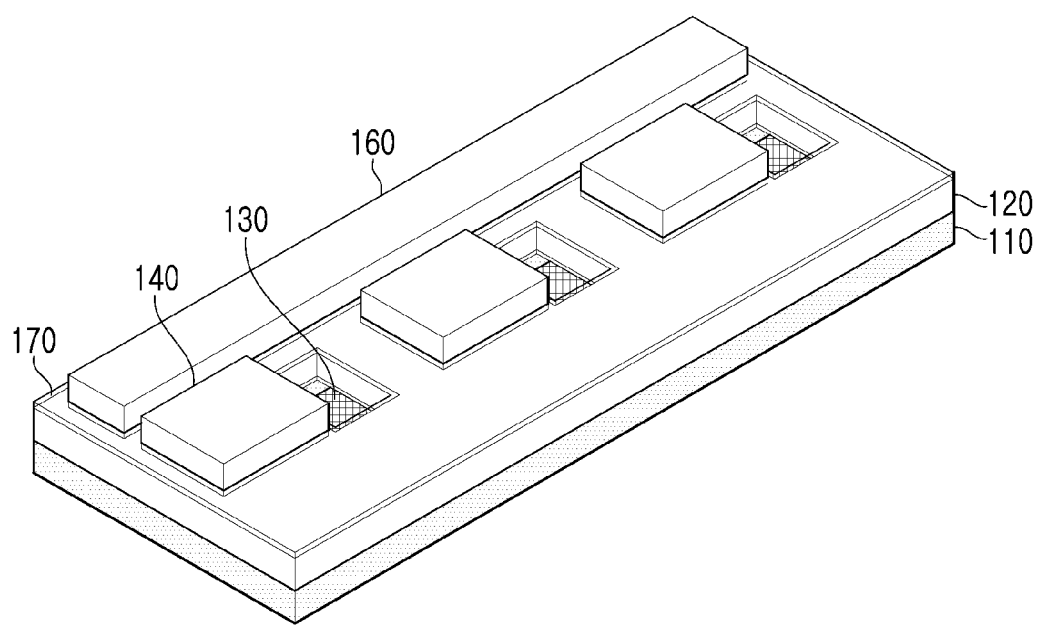

Referring to FIG. 26, the gate insulating layer 170 may be formed on the entire surface of the insulating layer 120. The gate insulating layer 170 may simultaneously perform a passivation function for protecting the graphene layers 130 and the exposed portions of the substrate 110 from the outside in addition to a function for insulating gate electrodes 180. Thus, the gate insulating layer 170 may be formed on the entire upper surface of the insulating layer 120 and may be formed to partially expose an upper portion of each of the source electrodes 140 and the drain electrode 160.

In addition, the gate insulating layer 170 needs to have light transmittance for the applied light and thus is preferably made of one of $Al_2O_3$ and $HfO_2$ which are transparent materials.

Figure 27:
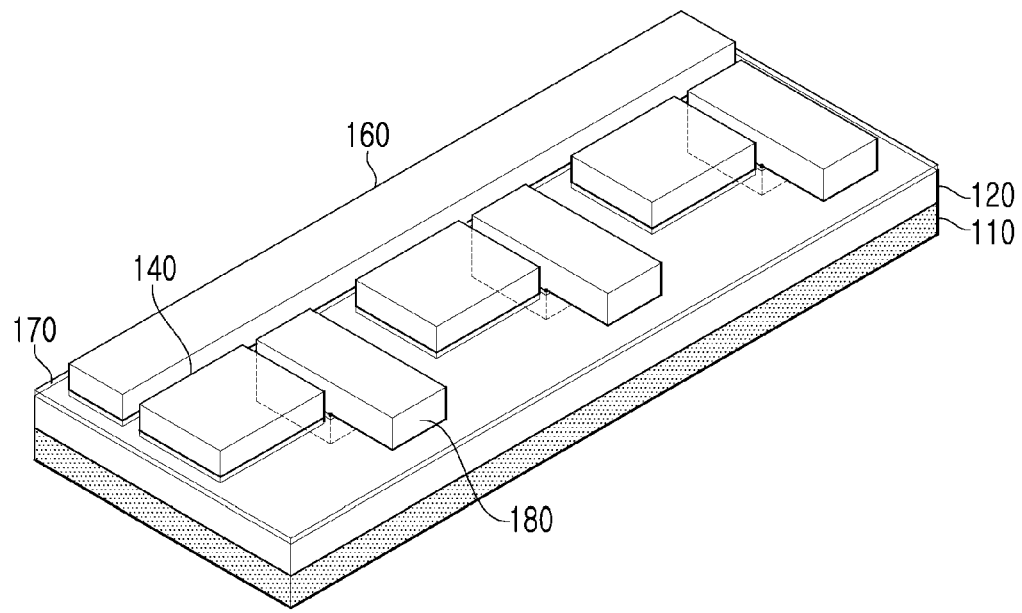

Referring to FIG. 27, the gate electrodes 180 may be formed on the gate insulating layer 170 so as to correspond to the source electrodes 140. In addition, the gate electrodes 180 are required to include a light-transmitting material and have conductivity. Accordingly, it is desirable that the gate electrode 180 includes a ZnO material.

Figure 28:
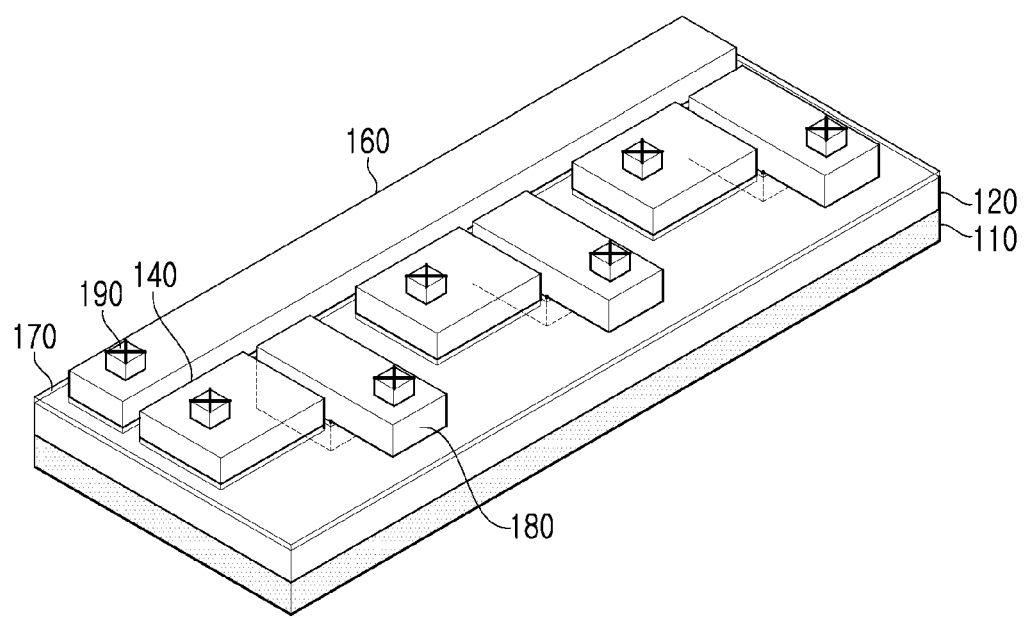

Referring to FIG. 28, an operation of forming separate wires 190 at an upper portion of the gate electrode 180, and upper portions of the source electrodes 140 and the drain electrode 160, which are exposed from the gate insulating layer 170, may be further included.

Figure 29:
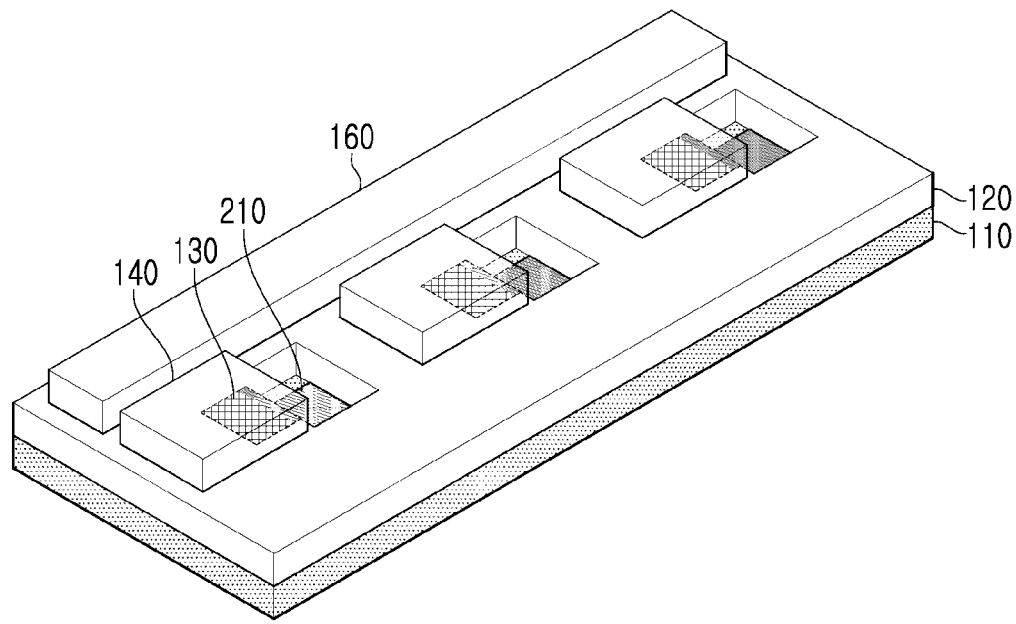
FIG. 29 is a view illustrating a method of manufacturing the photodetector according to the fifth embodiment of the present inventive concept.

FIG. 29 is a view illustrating a method of manufacturing the graphene-semiconductor heterojunction photodetector in the form of an array according to the fifth embodiment of the present inventive concept.

Referring to FIG. 29, a manufacturing method of the graphene-semiconductor heterojunction photodetector 500 in the form of an array according to the fifth embodiment of the present inventive concept is the same as the manufacturing method of the photodetector 400 according to the fourth embodiment until the operations of the manufacturing method illustrated with reference to FIGS. 21 to 25. That is, the manufacturing method has the same operations until the operations of forming an insulating layer 120 on a substrate 110, forming graphene layers 130 in the form of an array on the substrate 110 and the insulating layer 120, and then forming source electrodes 140 and a drain electrode 160 on the graphene layers 130 and the substrate 110, respectively. Thereafter, forming dopant layers 210 on exposed portions of the graphene layer 130 may be further included. That is, as shown in FIG. 29, an exposed surface of the graphene layer 130 except for a portion of the graphene layer 130, on which the source electrode 140 is formed, is doped with an n-type or p-type impurity.

The dopant layer 210 is manufactured, for example, by applying a dopant solution over the graphene layer 130 at a corresponding site through bar-coating or spin-coating in dry air, and vacuum drying. Since the dopant layer 210 is in contact with the graphene layer 130, dopants located near the interface are chemically adsorbed on and doped (chemically doped) into the graphene layer 130.

As an example, the dopant layer 210 may be doped with a p-type material (PAA) or an n-type material (PEI). That is, when the dopant layer 210 doped with a p-type impurity is formed on the graphene layer 130, it may operate as a p-type semiconductor, and when the dopant layer 210 doped with an n-type impurity is formed on the graphene layer 130, it may operate as an n-type semiconductor.

Operations after the above-described operation of forming the dopant layer 210 on the surface of the graphene layer 130 are the same as those illustrated with reference to FIGS. 26 to 28 in the method of manufacturing the photodetector 400 according to the fourth embodiment.

Figure 30:
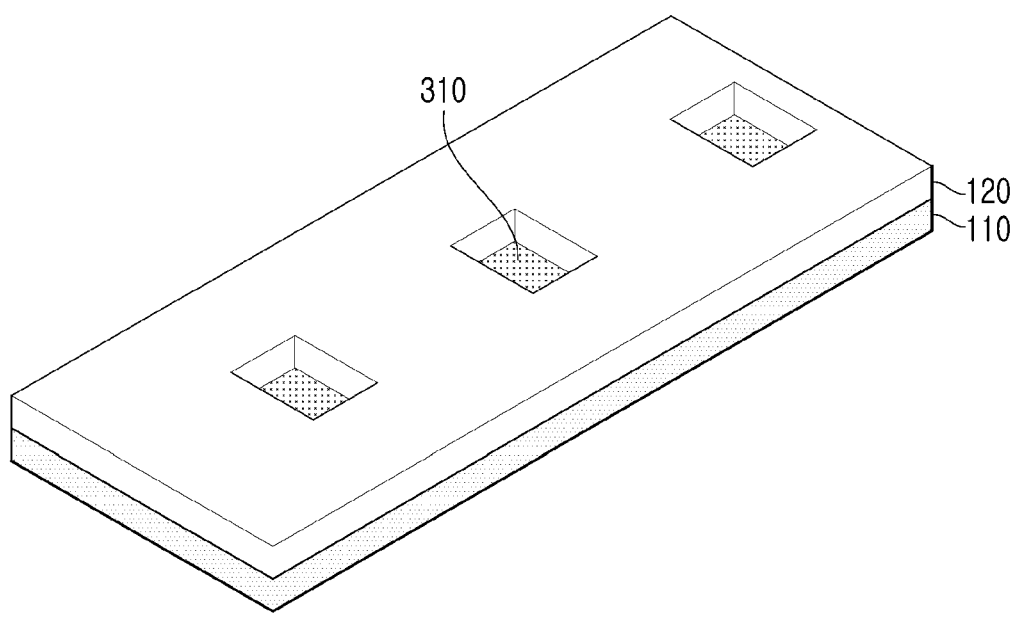
FIG. 30 is a view illustrating a method of manufacturing the photodetector according to the sixth embodiment of the present inventive concept.

FIG. 30 is a view illustrating a method of manufacturing the graphene-semiconductor heterojunction photodetector in the form of an array according to the sixth embodiment of the present inventive concept.

Referring to FIG. 30, a manufacturing method of the graphene-semiconductor heterojunction photodetector 600 in the form of an array according to the sixth embodiment of the present inventive concept is the same as the manufacturing method of the photodetector 400 according to the fourth embodiment until the operations of the manufacturing method illustrated with reference to FIGS. 21 to 22. That is, the manufacturing method has the same operations until the operations of forming an insulating layer 120 on a substrate 110 and exposing a portion of the substrate 110 using a process of etching the insulating layer 120 to form a graphene layer 130 on the exposed portion of the substrate 110.

Thereafter, forming an intermediate layer 310 on the exposed portion of the substrate 110 may be further included.

That is, the intermediate layer 310 may be formed between the substrate 110 and the graphene layer 130. In addition, a tunneling current may be formed between the substrate 110 and the graphene layer 130 due to the insertion of the intermediate layer 310. The material for forming the intermediate layer 310 may include one of $Al_2O_3$ and $TiO_2$ materials, and preferably, the intermediate layer 310 may be made of an $Al_2O_3$ material.

By inserting the intermediate layer 310 between the heterojunction components, the substrate 110 and the graphene layer 130, as described above, due to the asymmetric tunneling effect at the interface, electron injection may decrease and hole injection may increase. Accordingly, an energy barrier increases by the intermediate layer 310 to decrease a dark current, and as the dark current decreases, there is an effect that photodetection efficiency may be improved.

Operations after the above-described operation of forming the intermediate layer 310 on the exposed portion of the substrate 110 are the same as those illustrated with reference to FIGS. 23 to 28 in the method of manufacturing the photodetector 400 according to the fourth embodiment.

As described above, in the graphene-semiconductor heterojunction photodetector according to the present inventive concept and the method of manufacturing the same, the source electrode 140 and the test electrode 150 are formed to face each other on the graphene layer 130, and the drain electrode 160 is formed in a direction perpendicular to the central region portion of the graphene layer 130, so that the drain electrode 160 may be physically separated from the graphene layer 130. In addition, since charges formed at the central region portion of the graphene layer 130 are transmitted to the drain electrode 160 through the substrate 110, high photosensitivity may be secured, and a high output voltage may be secured for the applied light. Accordingly, the drain electrode 160 is formed at a side surface of the graphene layer 130, so that the size of the drain electrode 160 may be easily controlled, and a high output voltage may be obtained.

Further, the intermediate layer 310 is formed between the heterojunction components, the substrate 110 and the graphene layer 130, so that, due to the asymmetric tunneling effect at the interface, electron injection may decrease and hole injection may increase. Accordingly, an energy barrier increases by the intermediate layer 310 to decrease a dark current, and as the dark current decreases, there is an effect that photodetection efficiency may be improved.

Furthermore, in the graphene-semiconductor heterojunction photodetector having an array form, the source electrodes 140 are each formed on each of the graphene layers 130 in the form of an array, and one drain electrode 160 is formed in a direction perpendicular to the graphene layers 130 in the form of an array and the source electrodes 140, so that the drain electrode 160 may be commonly used. That is, since the drain electrode 160 is commonly used, there is an effect that the light-receiving area per unit area of the photodetector increases. In addition, since the drain electrode 160 is formed to extend along the entire width of the array of the source electrodes 140, wiring between the drain electrode 160 and the desired source electrode 140 may be selectively performed. Thus, an operating point may be arbitrarily changed according to the wiring of the desired source electrode 140.

Meanwhile, it should be understood that various embodiments of the present inventive concept disclosed in the present specification and the drawings are only illustrative of specific examples for purposes of facilitating understanding and are not intended to limit the scope of the present inventive concept. It is clear to those skilled in the art that the present inventive concept may be variously changed and modified within a range which does not depart from the technical gist of the present inventive concept in addition to the example embodiments disclosed herein.

What is claimed is:

1. A graphene-semiconductor heterojunction photodetector comprising:
    a substrate;
    an insulating layer formed on the substrate;
    a graphene layer formed to extend from the substrate to the insulating layer;
    a source electrode formed on the insulating layer at one end of the extended graphene layer;
    a drain electrode formed on the substrate;
    a gate insulating layer formed on the graphene layer; and
    a gate electrode formed on the gate insulating layer and having light transmittance,
    wherein the drain electrode is physically separated from the graphene layer and is formed in a direction perpendicular to a direction in which the source electrode is connected to the graphene layer.

2. The graphene-semiconductor heterojunction photodetector of claim 1, further comprising a test electrode formed on the other end of the extended graphene layer at a portion facing the source electrode.

3. The graphene-semiconductor heterojunction photodetector of claim 2, wherein the gate electrode is formed between the source electrode and the test electrode.

4. The graphene-semiconductor heterojunction photodetector of claim 2, further comprising a dopant layer doped with a p-type or n-type impurity on a surface of the graphene layer.

5. The graphene-semiconductor heterojunction photodetector of claim 4, wherein the dopant layer includes at least one material of polyacrylic acid (PAA) and polyethyleneimine (PEI).

6. The graphene-semiconductor heterojunction photodetector of claim 4, wherein the dopant layer is formed on the surface of the graphene layer except for portions in contact with the source electrode and the test electrode.

7. The graphene-semiconductor heterojunction photodetector of claim 1, wherein the gate insulating layer shields an exposed portion of each of the graphene layer and a surface of the substrate.

8. The graphene-semiconductor heterojunction photodetector of claim 2, further comprising a wire connected to an exposed upper surface of each of the source electrode, the test electrode, the drain electrode, and the gate electrode, wherein the upper surface of each of the source electrode, the test electrode, the drain electrode, and the gate electrode is exposed from the gate insulating layer.

9. The graphene-semiconductor heterojunction photodetector of claim 1, further comprising an intermediate layer formed between the substrate and the graphene layer.

10. The graphene-semiconductor heterojunction photodetector of claim 9, wherein the intermediate layer includes one material among $Al_2O_3$ and $HfO_2$ materials.

11. The graphene-semiconductor heterojunction photodetector of claim 9, wherein
    a tunneling current is formed between the substrate and the graphene layer due to the intermediate layer.

12. The graphene-semiconductor heterojunction photodetector of claim 1, wherein the drain electrode is formed at a side surface of a central region portion of the graphene layer.

13. The graphene-semiconductor heterojunction photodetector of claim 1, wherein
    the graphene layer, the source electrode, and the gate electrode have an array form, and
    the drain electrode is formed to extend along the entire width of the array of the source electrodes so as to be disposed adjacent to the source electrodes having an array form.

14. The graphene-semiconductor heterojunction photodetector of claim 13, wherein the drain electrode is electrically connected to one of the source electrodes adjacent thereto.

15. The graphene-semiconductor heterojunction photodetector of claim 13, wherein the graphene layers having an array form have areas with different sizes.

* * * * *